(12) United States Patent
Niida

(10) Patent No.: US 11,688,916 B2
(45) Date of Patent: Jun. 27, 2023

(54) IMPEDANCE CONVERTER AND ELECTRONIC DEVICE

(71) Applicant: FUJITSU LIMITED, Kawasaki (JP)

(72) Inventor: Yoshitaka Niida, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 387 days.

(21) Appl. No.: 17/143,195

(22) Filed: Jan. 7, 2021

(65) Prior Publication Data
US 2021/0249745 A1    Aug. 12, 2021

(30) Foreign Application Priority Data
Feb. 12, 2020    (JP) .............................. JP2020-021704

(51) Int. Cl.
| | |
|---|---|
| *H01Q 1/24* | (2006.01) |
| *H01P 1/00* | (2006.01) |
| *H03F 1/56* | (2006.01) |
| *H03F 3/19* | (2006.01) |
| *H01P 3/10* | (2006.01) |

(52) U.S. Cl.
CPC ................. *H01P 1/00* (2013.01); *H01P 3/10* (2013.01); *H03F 3/19* (2013.01); *H03F 2200/451* (2013.01)

(58) Field of Classification Search
CPC ... H01P 1/00; H01P 3/10; H01P 5/028; H01Q 1/24; H01Q 1/22; H03F 2200/451; H03F 3/19; H03F 1/56; H03F 3/195; H03F 3/602
See application file for complete search history.

(56) References Cited

U.S. PATENT DOCUMENTS

| | | | | |
|---|---|---|---|---|
| 8,330,552 B2 * | 12/2012 | Li | ............................ | H01P 5/187 333/116 |
| 8,896,496 B2 * | 11/2014 | Kittinger | .................. | H01Q 1/40 343/873 |
| 9,628,032 B1 * | 4/2017 | Marbell | .................... | H03F 3/195 |
| 10,903,542 B1 * | 1/2021 | Al-Bondak | ........... | H01P 11/003 |
| 2014/0132344 A1 | 5/2014 | Outaleb | | |
| 2015/0200631 A1 * | 7/2015 | Outaleb | ................... | H03F 3/195 330/295 |
| 2020/0083848 A1 * | 3/2020 | Zhou | ...................... | H03F 3/3001 |

FOREIGN PATENT DOCUMENTS

| | | | | |
|---|---|---|---|---|
| CN | 107196609 A | * | 9/2017 | ............... H03F 1/00 |
| JP | 2011-244070 A | | 12/2011 | |
| JP | 2014-523717 A | | 9/2014 | |
| WO | 2013/006941 A1 | | 1/2013 | |
| WO | WO-2020235040 A1 | * | 11/2020 | ............... H01P 3/088 |

* cited by examiner

*Primary Examiner* — Tho G Phan
(74) *Attorney, Agent, or Firm* — Fujitsu Patent Center

(57) ABSTRACT

An impedance converter includes an insulating layer; a first wire provided on a first surface of the insulating layer and extending in a first direction; a second wire provided on a second surface of the insulating layer and extending in the first direction and face the first wire, the second surface being located on a side opposite to the first surface; a third wire provided on the first surface and extending in a second direction orthogonal to the first direction; a fourth wire provided on the second surface and extending in the second direction and face the third wire; a fifth wire provided on the first surface and extending in the second direction; and a sixth wire provided on the second surface and extending in the second direction and face the fifth wire.

10 Claims, 18 Drawing Sheets

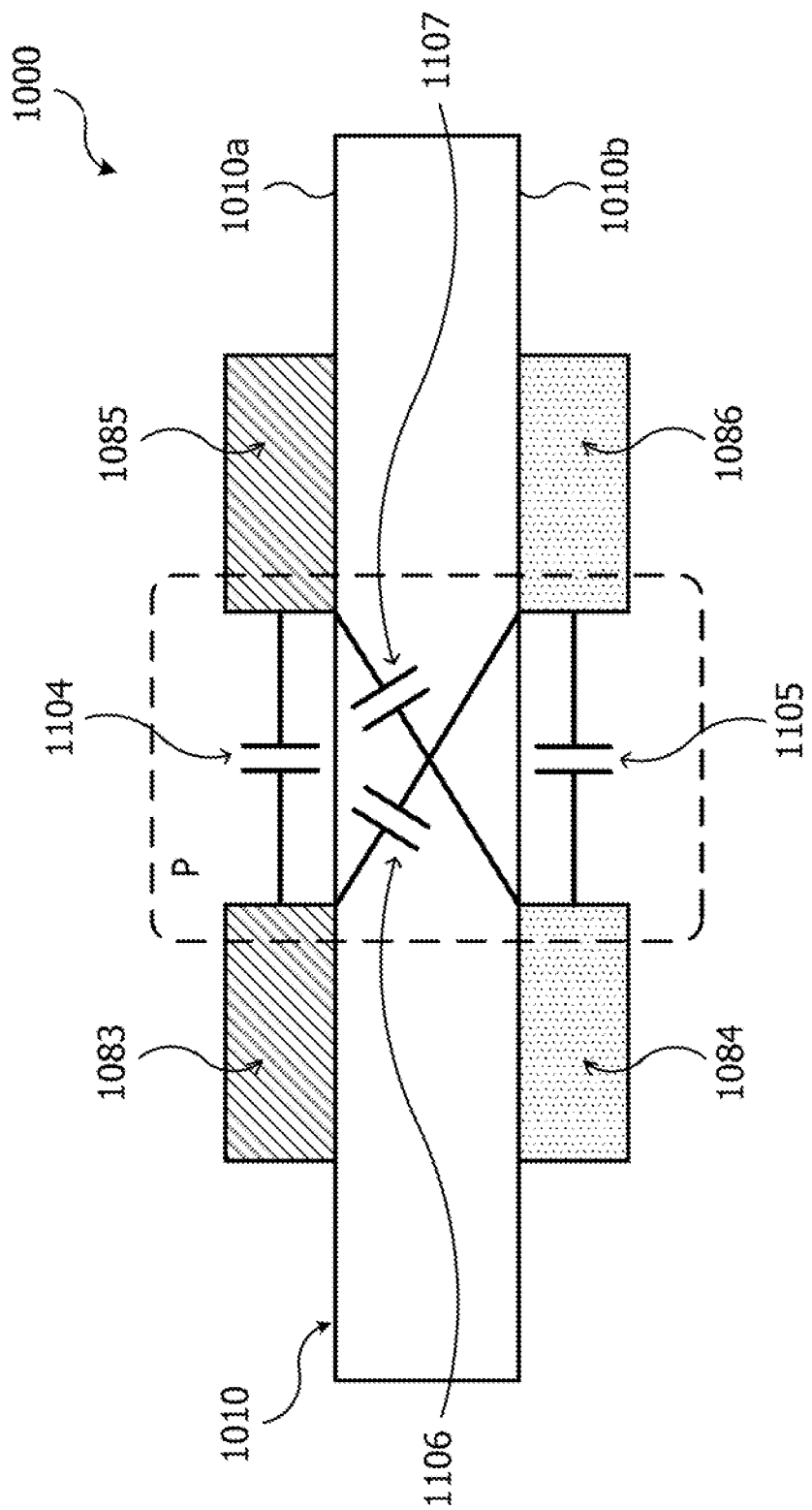

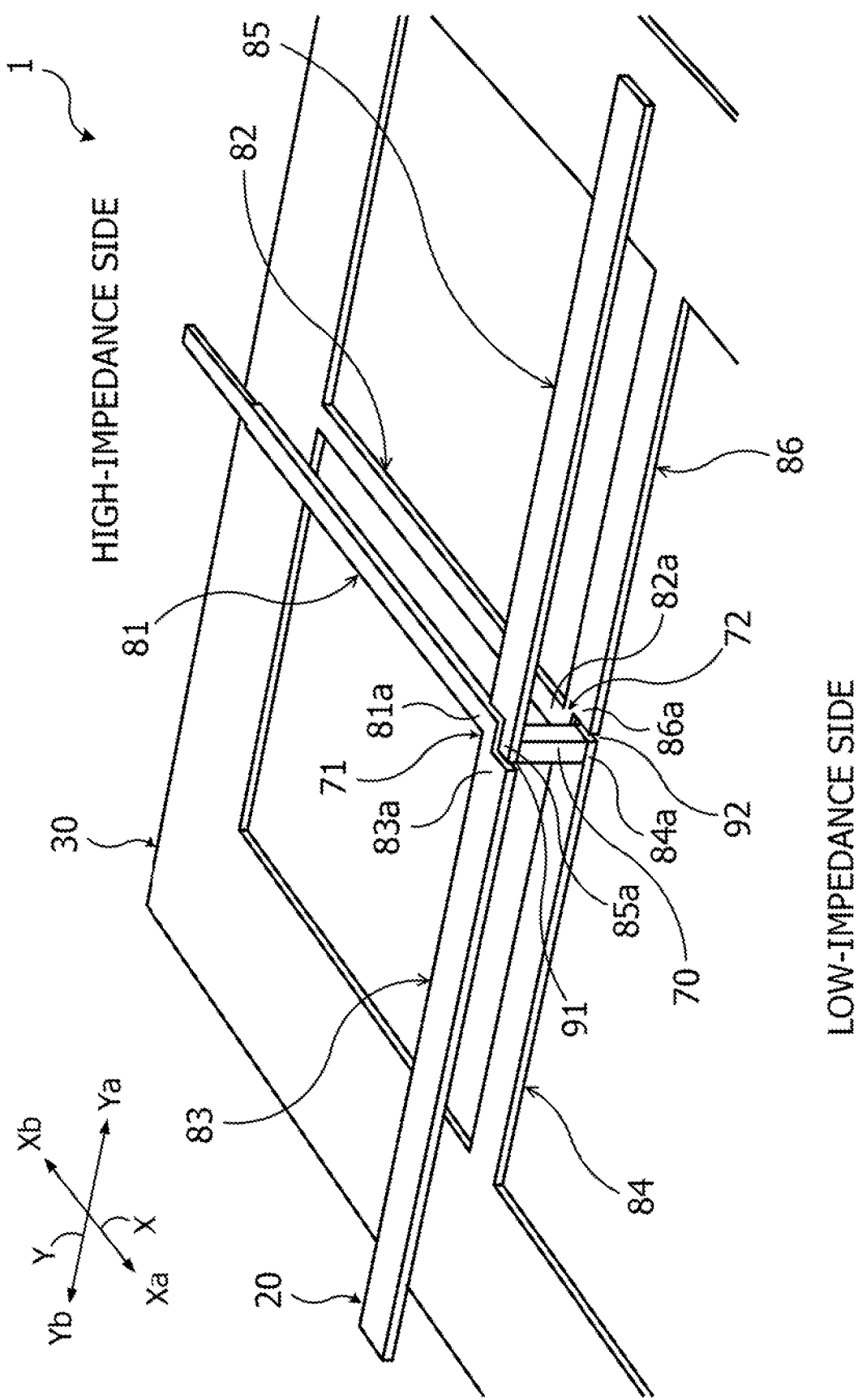

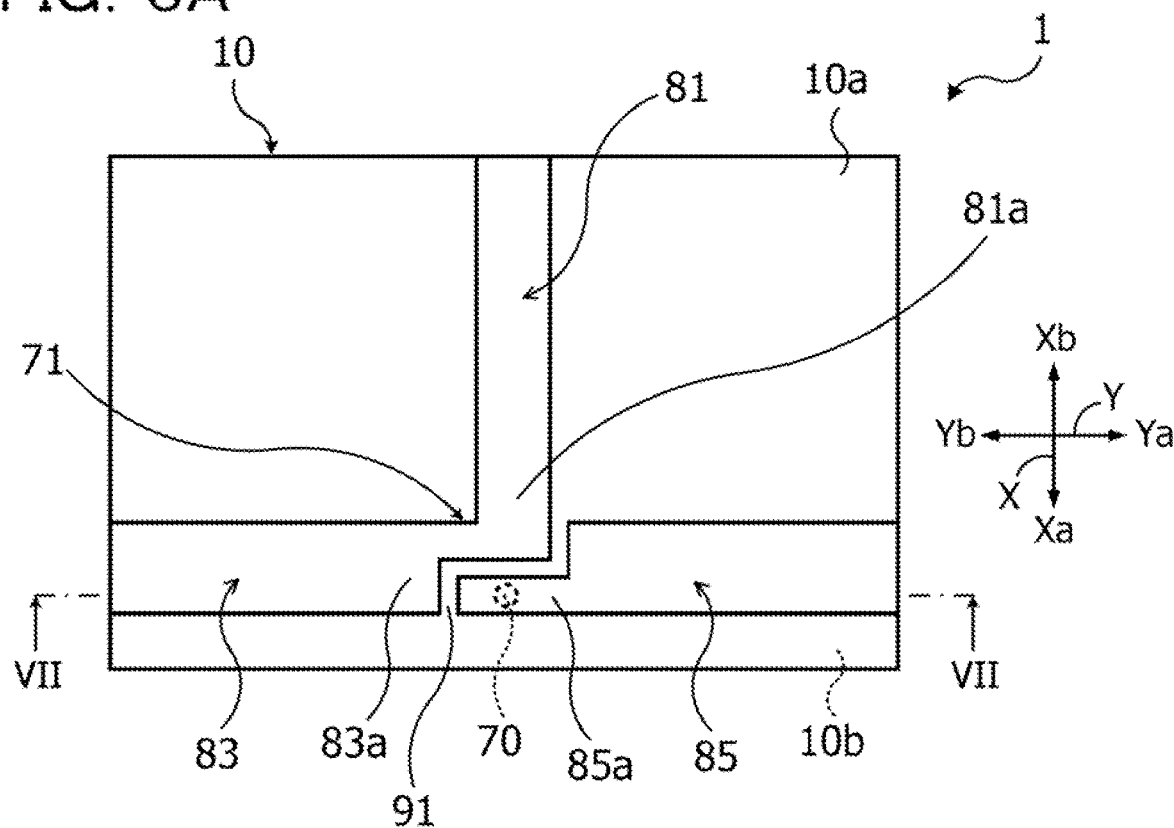
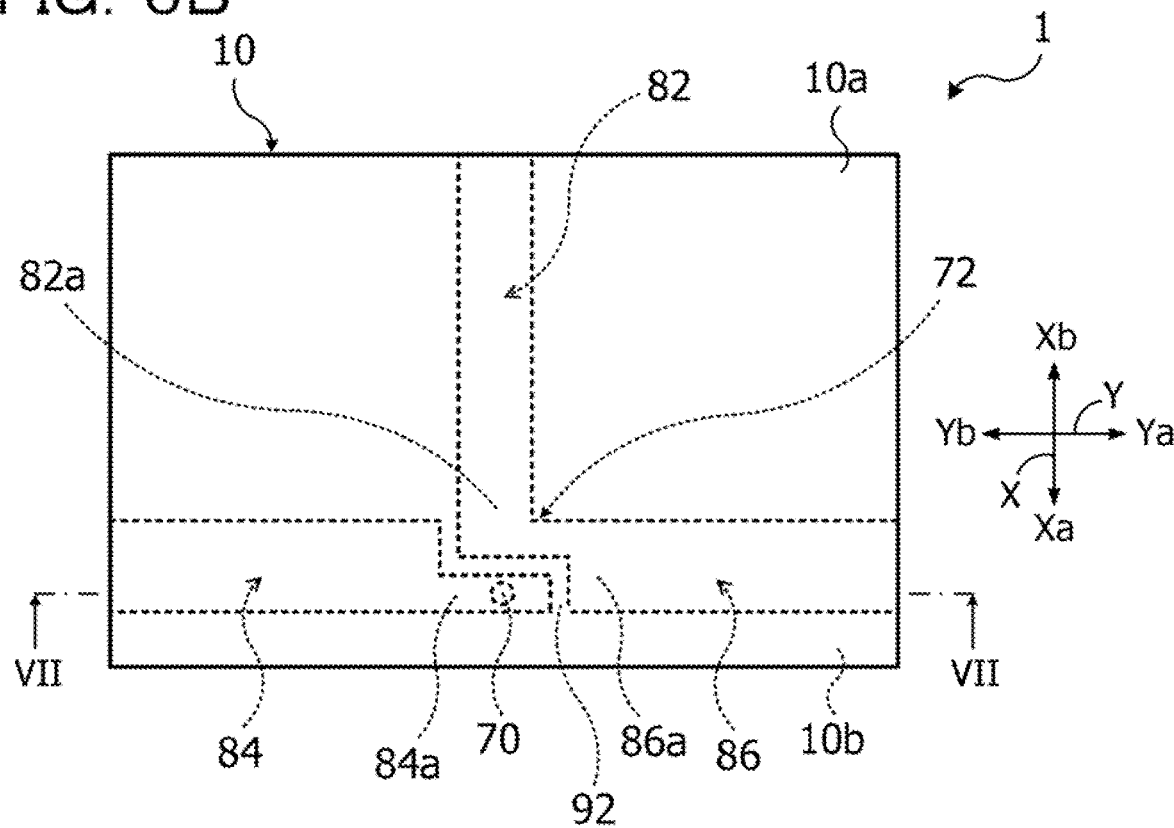

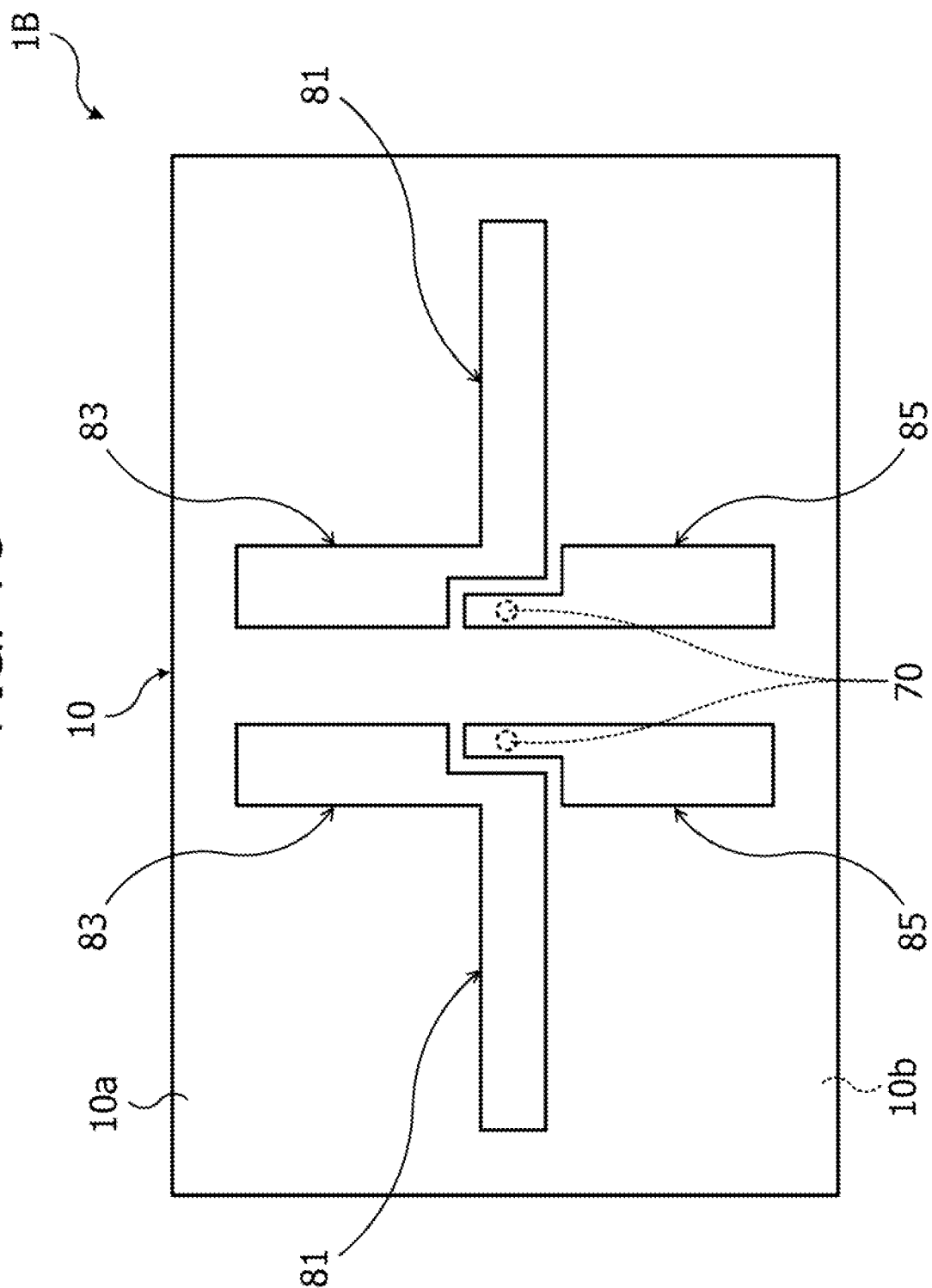

IMPEDANCE CONVERTER AND ELECTRONIC DEVICE

CROSS-REFERENCE TO RELATED APPLICATION

This application is based upon and claims the benefit of priority of the prior Japanese Patent Application No. 2020-21704, filed on Feb. 12, 2020, the entire contents of which are incorporated herein by reference.

FIELD

The embodiments discussed herein are related to an impedance converter and an electronic device.

BACKGROUND

There is known an impedance conversion technique for converting impedance on the sending side such that the impedance matches impedance on the receiving side in signal transmission between electronic elements. In addition, circuits, devices, apparatuses, and the like using such an impedance conversion technique are also known.

For example, there is known an example in which the impedance conversion technique is used for a power amplifier to be used for wireless communication. As an example, a Doherty-type radio frequency (RF) power amplifier is known in which a broadband impedance converter including a directional coupler and a quarter-wavelength matching line coupled to the directional coupler is provided in a stage prior to an antenna. Furthermore, there is also known a power amplifier in which a transmission line transformer and a variable impedance circuit are provided in a stage prior to an antenna. In the transmission line transformer, transmission lines on the primary side and the secondary side are AC-connected by electromagnetic field coupling. The variable impedance circuit is connected to the output side of the transmission line transformer. International Publication Pamphlet No. WO 2013/006941 and Japanese Laid-open Patent Publication No. 2011-244070 are known as related art.

In an impedance converter that performs signal transmission and impedance conversion by using electromagnetic field coupling between conductor layers facing each other, unnecessary electromagnetic field coupling may occur depending on the layout of a pair of the conductor layers that causes electromagnetic field coupling. Such unnecessary electromagnetic field coupling may deteriorate characteristics of the impedance converter.

On one aspect, it is an object of the embodiments to implement an impedance converter that enables occurrence of unnecessary electromagnetic field coupling to be avoided and has excellent characteristics.

SUMMARY

According to an aspect of the embodiments, an impedance converter includes an insulating layer; a first wire provided on a first surface of the insulating layer and extending in a first direction; a second wire provided on a second surface of the insulating layer and extending in the first direction and face the first wire, the second surface being located on a side opposite to the first surface; a third wire provided on the first surface and extending in a second direction orthogonal to the first direction; a fourth wire provided on the second surface and extending in the second direction and face the third wire; a fifth wire provided on the first surface and extending in the second direction; and a sixth wire provided on the second surface and extending in the second direction and face the fifth wire.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 4 is a diagram describing a phenomenon that may occur n the impedance converter;

FIG. 5 is a diagram (No, 1) describing an example of an impedance converter according to a first embodiment;

FIGS. 6A and 6B are diagrams (No. 2) describing the example of the impedance converter according to the first embodiment;

FIGS. 14A and 146 are diagrams describing a first example of an electronic device according to a third embodiment;

FIGS. 15A and 156 are diagrams describing a second example of the electronic device according to the third embodiment;

FIG. 16 is a diagram (No. 1) describing a third example of the electronic device according to the third embodiment;

FIGS. 17A and 176 are diagrams (No. 2) describing the third example of the electronic device according to the third embodiment.

DESCRIPTION OF EMBODIMENTS

In an impedance converter that performs signal transmission and impedance conversion by using electromagnetic field coupling between conductor layers facing each other, unnecessary electromagnetic field coupling may occur depending on the layout of a pair of the conductor layers that causes electromagnetic field coupling. Such unnecessary electromagnetic field coupling may deteriorate characteristics of the impedance converter. In view of the above, it is desirable to implement an impedance converter that enables occurrence of unnecessary electromagnetic field coupling to be avoided and has excellent characteristics.

First, an example of an impedance converter will be described.

Figure 1:
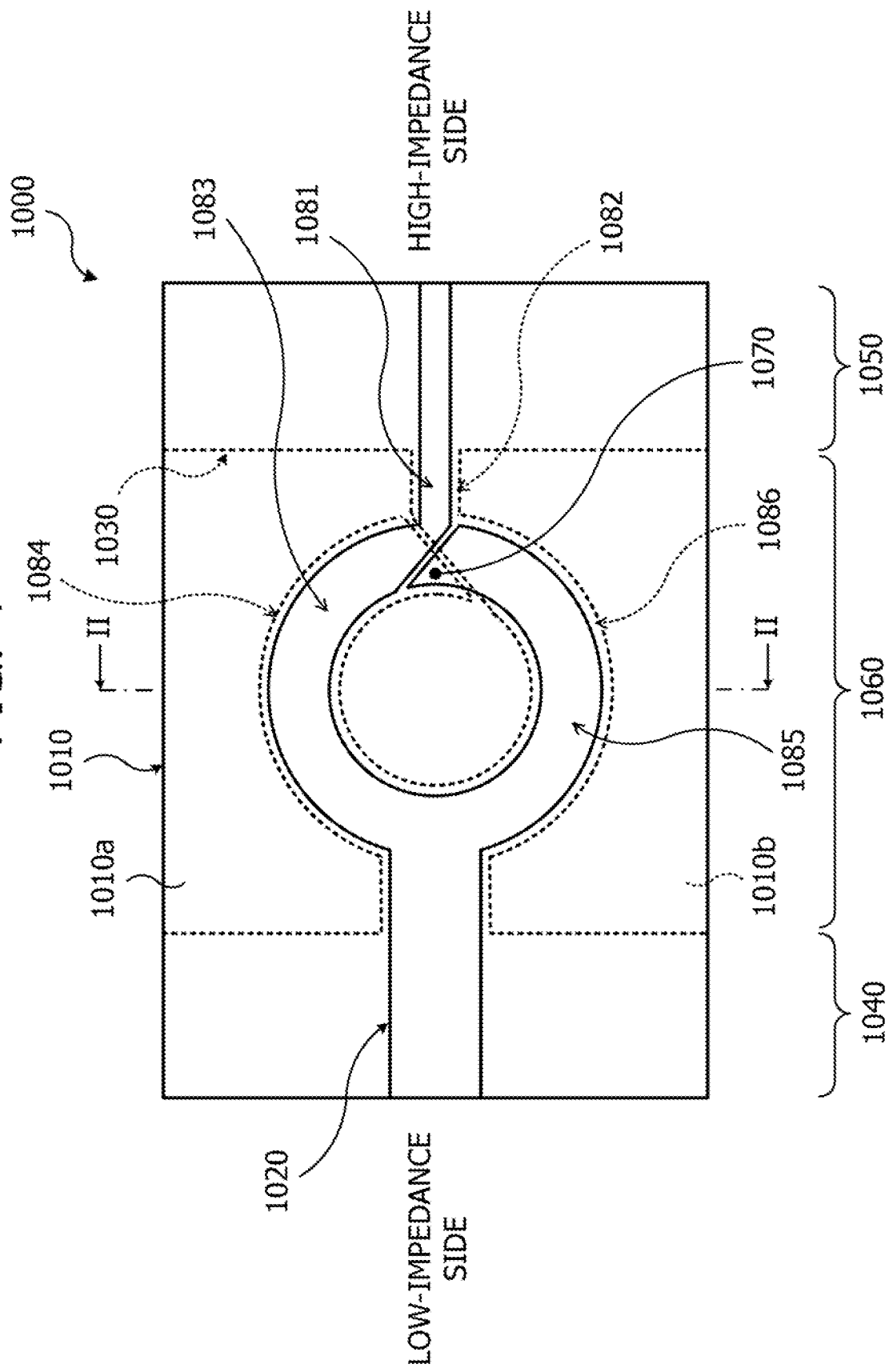
FIG. 1 is a diagram (No. 1) describing an example of an impedance converter.
Figure 2:
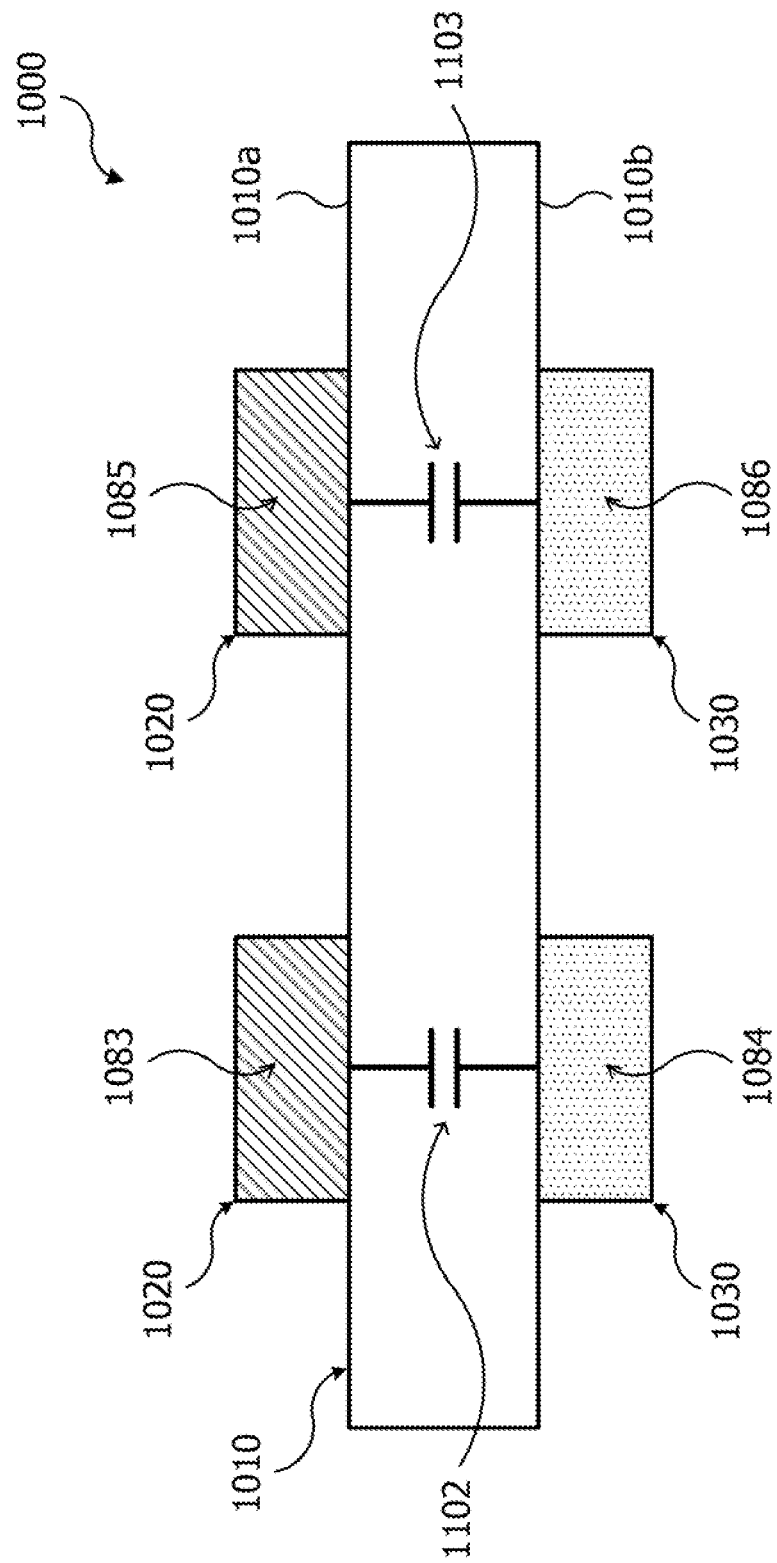
FIG. 2 is a diagram (No. 2) describing the example of the impedance converter.
Figure 3:
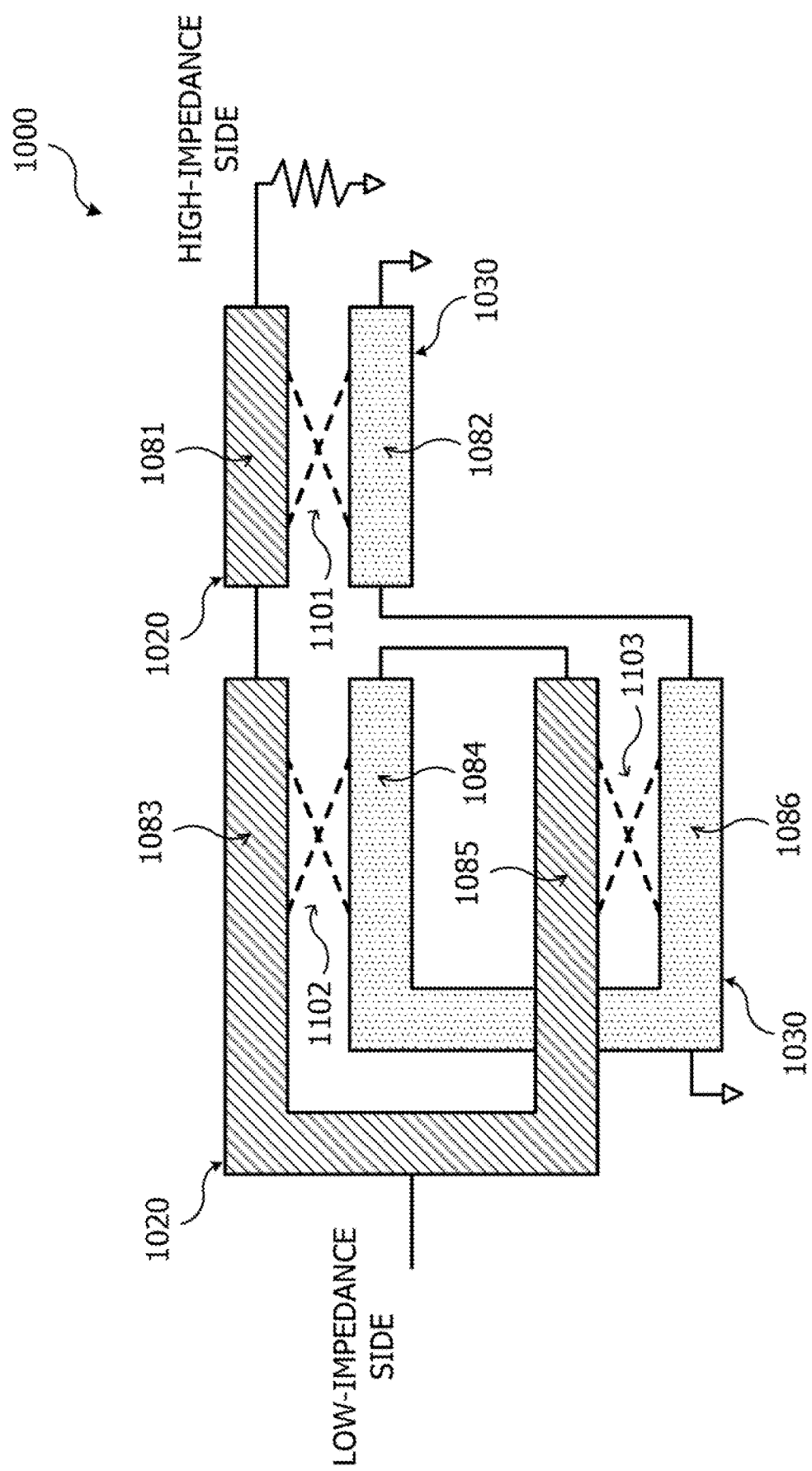
FIG. 3 is a diagram (No. 3) describing the example of the impedance converter.

FIGS. 1 to 3 are diagrams describing an example of an impedance converter. FIG. 1 is a schematic plan view of a main part of the impedance converter cited as the example. FIG. 2 is a schematic cross-sectional view of the impedance converter taken along line II-II in FIG. 1. FIG. 3 is an equivalent circuit diagram of the impedance converter cited as the example.

An impedance converter 1000 illustrated in FIGS. 1 to 3 is an example of a Guanella type impedance converter.

As illustrated in FIGS. 1 and 2, the impedance converter 1000 includes a conductor layer 1020 and a conductor layer 1030. The conductor layer 1020 is provided on a surface 1010a that is one surface of an insulating layer 1010. The conductor layer 1030 is provided on a surface 1010b that is the other surface of the insulating layer 1010. The conductor layer 1020 is a wire that functions as an input/output port for a signal to be transmitted or a wire connected to such an input/output port. The conductor layer 1030 is a wire that has a ground potential.

The impedance converter 1000 includes regions 1040 and 1050 in which the conductor layer 1020 and the conductor layer 1030 are laid out in such a way as to form a microstrip line structure, and a region 1060 located between the region 1040 and the region 1050. In the region 1060, the conductor layer 1020 and the conductor layer 1030 are formed in a C-shape in a plan view and laid out in such a way as to face each other as illustrated in, for example, FIG. 1. The conductor layer 1020 of the region 1060 includes three parts of a wire 1081, a wire 1083, and a wire 1085. The conductor layer 1030 of the region 1060 includes three parts of a wire 1082, a wire 1084, and a wire 1086. In the region 1060, one end portion (wire 1085) of the C-shaped conductor layer 1020 and one end portion (wire 1084) of the C-shaped conductor layer 1030 are connected by a conductor via 1070 provided in such a way as to penetrate the insulating layer 1010.

Note that in FIG. 1, the conductor layer 1020 provided on the surface 1010a that is the one surface of the insulating layer 1010 is represented by a solid line, and the conductor layer 1030 provided on the surface 1010b that is the other surface of the insulating layer 1010 is represented by a dotted line. In FIG. 1, for the sake of convenience, the conductor layer 1030 is illustrated in the region 1060 with a width larger than that of the conductor layer 1020, but the conductor layer 1030 may be provided such that the conductor layer 1030 and the conductor layer 1020 are identical in width.

The impedance converter 1000 is used to match impedance (output impedance) of an electronic element (circuit or part) on the signal transmitting side with impedance (input impedance) of an electronic element (circuit or part) on the signal receiving side. In the impedance converter 1000, one region, for example, the region 1040 is connected to a low-impedance side electronic element of, for example, 12.5Ω and the region 1050, which is the other region, is connected to a high-impedance side electronic element of, for example, 50Ω. A signal is transmitted from the region 1040 through the region 1060 to the region 1050, for example.

When a signal is transmitted, the wire 1083, which is a part of the C-shaped conductor layer 1020, and the wire 1084, which is a part of the C-shaped conductor layer 1030, are connected by an electromagnetic field coupling 1102 in the region 1060, as illustrated in FIGS. 2 and 3. Similarly, the wire 1085, which is a part of the C-shaped conductor layer 1020, and the wire 1086, which is a part of the C-shaped conductor layer 1030, are connected by an electromagnetic field coupling 1103 in the region 1060, as illustrated in FIG. 3. Similarly, the wire 1081, which is a part of the C-shaped conductor layer 1020, and the wire 1082, which is a part of the C-shaped conductor layer 1030, are connected by an electromagnetic field coupling 1101 in the region 1060, as illustrated in FIG. 3. The wire 1084, which is a part of the conductor layer 1030, and the wire 1085, which is a part of the conductor layer 1020, are connected by the conductor via 1070 as illustrated in, for example, FIG. 1.

A signal output from the electronic element on the low-impedance side is transmitted through the conductor layer 1020 (microstrip line) of the region 1040 in the impedance converter 1000. The signal transmitted to the region 1040 is transmitted through the region 1060 that includes the wires 1083 and 1084 connected by the electromagnetic field coupling 1102, the wires 1085 and 1086 connected by the electromagnetic field coupling 1103, and the wires 1081 and 1082 connected by the electromagnetic field coupling 1101. Then, the signal transmitted through the wire 1081 of the region 1060 is transmitted to the conductor layer 1020 (microstrip line) of the region 1050 and input to the electronic element on the high-impedance side.

The impedance converter 1000 matches an impedance on the region 1040 side (for example, 123Ω) with an impedance on the region 1050 side (for example, 50Ω). As a result of impedance matching performed by the impedance converter 1000, the output from the electronic element on the low-impedance side is efficiently input to the electronic element on the high-impedance side while reflection is reduced.

In the impedance converter 1000 with a configuration as described above, a phenomenon as illustrated in FIG. 4 to be described below may occur depending on the layout of the conductor layer 1020 and the conductor layer 1030.

FIG. 4 is a diagram describing a phenomenon that may occur in the impedance converter. FIG. 4 is a schematic cross-sectional view (cross-sectional view taken along line II-II in FIG. 1) of a main part of the impedance converter cited as the example, corresponding to FIG. 2 described above.

As illustrated in FIGS. 2 and 3 described above, the electromagnetic field coupling 1102 occurs between the wire 1083 and the wire 1084 in the region 1060, in which the C-shaped conductor layers 1020 and 1030 are provided, in the impedance converter 1000. Similarly, the electromagnetic field coupling 1103 occurs between the wire 1085 and the wire 1086.

Here, when the wires are laid out such that the wire 1083 and the wire 1085 of the conductor layer 1020 are close to each other and the wire 1084 and the wire 1086 of the conductor layer 1030 are close to each other, the following may occur. For example, as schematically illustrated in a region P surrounded by a chain line frame in FIG. 4, an electromagnetic field coupling 1104 may also occur between the wire 1083 and the wire 1085, or an electromagnetic field coupling 1105 may also occur between the wire 1084 and the wire 1086. Moreover, an electromagnetic field coupling 1106 may also occur between the wire 1083 and the wire 1086, or an electromagnetic field coupling 1107 may also occur between the wire 1085 and the wire 1084.

Unlike the electromagnetic field couplings 1102 and 1103 (and the electromagnetic field coupling 1101) caused for signal transmission and impedance conversion to be originally performed by the impedance converter 1000, the electromagnetic field couplings 1104, 1105, 1106, and 1107 as illustrated in FIG. 4 are, so to speak, unnecessary electromagnetic field couplings. When the unnecessary electromagnetic field couplings 1104, 1105, 1106, and 1107 occur as described above, characteristics of the impedance converter 1000 such as band characteristics may deteriorate.

As an example, the impedance converter 1000 as described above may be used for a power amplifier. Power amplifiers are being used for various purposes in a wide range of fields, such as radar, communications, and jamming. In order to achieve high output and wide bandwidth, it is effective to use a matching circuit capable of impedance conversion over a wide frequency range for a power amplifier. For example, a power amplifier including a high electron mobility transistor (HEMT) formed by use of a nitride semiconductor such as gallium nitride (GaN) is known as one of power amplifiers. In such a power amplifier, it is desirable to use a circuit capable of impedance conversion over wide frequency ranging from frequency for the HEMT (Z<<50Ω) having a sufficiently small impedance (Z) to frequency for an output terminal (Z=50Ω).

When the impedance converter 1000 as described above is used as the matching circuit of the power amplifier, occurrence of the unnecessary electromagnetic field coupling 1104, 1105, 1106, and 1107 as illustrated in FIG. 4 will deteriorate band characteristics of the impedance converter 1000.

In principle, the unnecessary electromagnetic field couplings 1104, 1105, 1106, and 1107 may be reduced by a layout in which the distance between the wire 1083 and the wire 1085 and the distance between the wire 1084 and the wire 1086 are increased, such as a layout in which the C-shaped portions in the region 1060 are increased in size.

However, in the impedance converter 1000, the lengths of the wires 1083, 1084, 1085, and 1086 of the C-shaped portions are determined depending on the wavelength of a signal to be transmitted. For example, in the case where a signal of about several GHz is transmitted, when the outlines of the C-shaped portions are circular, the radii of the circles are set to about 3 mm to 6 mm while the widths of the wires 1083, 1084, 1085, and 1086 are set to 3 mm. Therefore, it is not desirable to unnecessarily increase the size of the C-shaped portions in the region 1060 so as to avoid the occurrence of the unnecessary electromagnetic field couplings 1104, 1105, 1106, and 1107.

Note that here, a deterioration in characteristics due to unnecessary electromagnetic field coupling that occurs in the C-shaped portions of the Guanella type impedance converter 1000 has been taken as an example. A deterioration in characteristics similar to that described above may occur not only in this case, but also in the case where a pair of conductor layers to be connected by electromagnetic field coupling is laid out in the vicinity of another conductor layer and unnecessary electromagnetic field coupling occurs between the pair of conductor layers and the another conductor layer.

In view of the above points, methods as shown as embodiments below are adopted here so as to avoid occurrence of unnecessary electromagnetic field coupling and reduce deterioration in the characteristics of the impedance converter due to the occurrence.

First Embodiment

Figure 7:
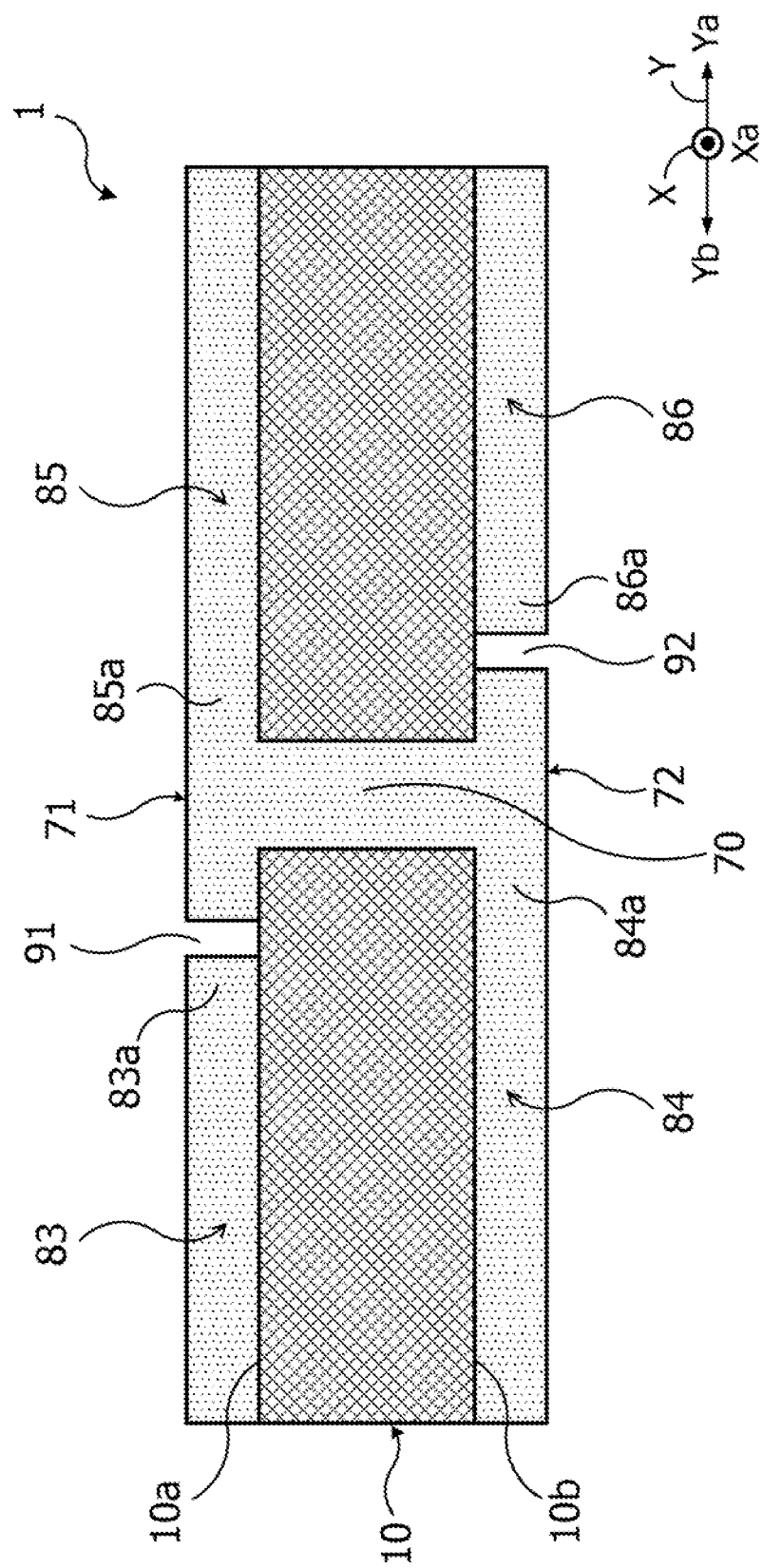
FIG. 7 is a diagram (No. 3) describing the example of the impedance converter according to the first embodiment.
Figure 8:
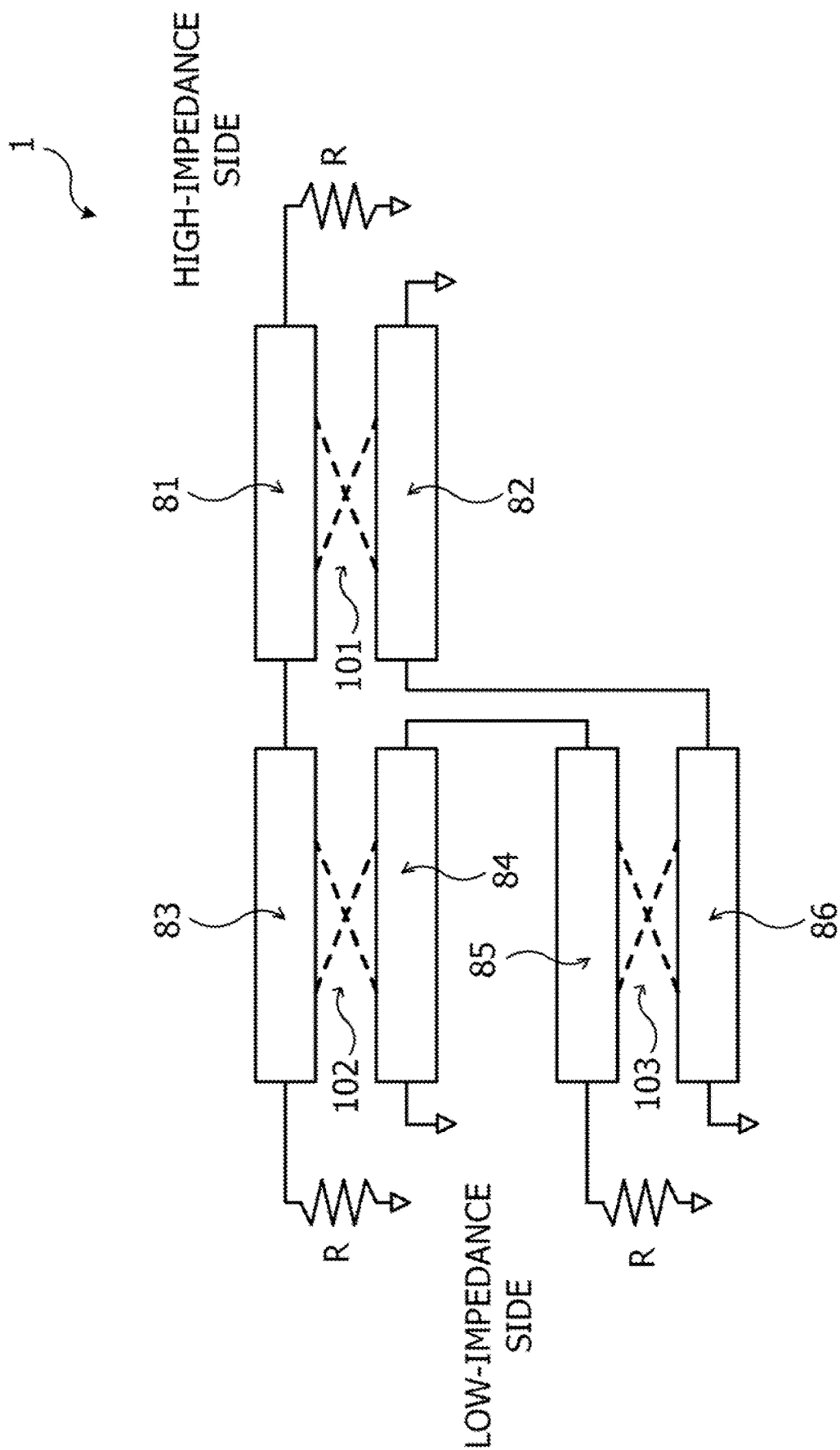
FIG. 8 is a diagram (No. 4) describing the example of the impedance converter according to the first embodiment.

FIGS. 5 to 8 are diagrams describing an example of an impedance converter according to a first embodiment. FIG. 5 is a schematic perspective view of a main part of the impedance converter cited as the example. FIGS. 6A and 6B are both schematic plan views of the main part of the impedance converter cited as the example. FIG. 7 is a schematic cross-sectional view of the impedance converter taken along line II-II in FIGS. 6A and 6B. FIG. 8 is an equivalent circuit diagram of the impedance converter cited as the example.

As illustrated in FIGS. 5 to 7, an impedance converter 1 includes a conductor layer 20 and a conductor layer 30. The conductor layer 20 is provided on a surface 10a that is one surface of an insulating layer 10. The conductor layer 30 is provided on a surface 10b that is the other surface of the insulating layer 10 (the surface 10b on a side opposite to the surface 10a that is the one surface of the insulating layer 10).

Here, for the sake of convenience, FIG. 5 does not illustrate the insulating layer 10 provided between the conductor layer 20 and the conductor layer 30 as illustrated in FIGS. 6A, 6B, and 7.

Furthermore, FIG. 6A is a plan view of a main part of the impedance converter 1 viewed from the surface 10a side of the insulating layer 10, which is a diagram for describing a planar shape of a main part of the conductor layer 20 provided on the surface 10a side of the insulating layer 10. For the sake of convenience, the conductor layer 30 provided on the surface 10b side of the insulating layer 10 is not illustrated in FIG. 6A.

As with FIG. 6A, FIG. 6B is a plan view of the main part of the impedance converter 1 viewed from the surface 10a side of the insulating layer 10, which is a diagram for describing a planar shape of a main part of the conductor layer 30 provided on the surface 10b side of the insulating layer 10. For the sake of convenience, the conductor layer 20 provided on the surface 10a side of the insulating layer 10 is not illustrated in FIG. 68.

As illustrated in FIGS. 5, 6A, and 7, the conductor layer 20 of the impedance converter 1 includes three parts of a wire 81, a wire 83, and a wire 85. As illustrated in FIGS. 5, 6B, and 7, the conductor layer 30 of the impedance converter 1 includes three parts of a wire 82, a wire 84, and a wire 86.

The wire 81 is provided on the surface 10a, which is the one surface of the insulating layer 10, in such a way as to extend in an X direction in a plan view.

The wire 82 is provided on the surface 10b, which is the other surface of the insulating layer 10, in such a way as to extend in the X direction in a plan view and face the wire 81.

The wire 83 is provided on the surface 10a, which is the one surface of the insulating layer 10, in such a way as to extend in a Y direction orthogonal to the X direction in a plan view.

The wire 84 is provided on the surface 10b, which is the other surface of the insulating layer 10, in such a way as to extend in the Y direction in a plan view and face the wire 83.

The wire 85 is provided on the surface 10a, which is the one surface of the insulating layer 10, in such a way as to extend in the Y direction in a plan view.

The wire 86 is provided on the surface 10b, which is the other surface of the insulating layer 10, in such a way as to extend in the Y direction in a plan view and face the wire 85.

The wire 82, the wire 84, and the wire 86 provided on the surface 10b, which is the other surface of the insulating layer 10 are wires having a ground potential.

The impedance converter 1 includes a connection portion 71 that connects an end portion 81a and an end portion 83a. The end portion 81a is an end portion of the wire 81, located on an Xa side in the X direction. The end portion 83a is an end portion of the wire 83, located on a Ya side in the Y direction. The connection portion 71 is formed by, for example, a conductor layer provided on the surface 10a, which is the one surface of the insulating layer 10, and continuous with the wire 81 and the wire 83.

The impedance converter 1 includes a connection portion 72 that connects an end portion 82a and an end portion 86a. The end portion 82a is an end portion of the wire 82, located on the Xa side in the X direction. The end portion 86a is an end portion of the wire 86, located on a Yb side opposite to the Ya side in the Y direction. The connection portion 72 is formed by, for example, a conductor layer provided on the surface 10b, which is the other surface of the insulating layer 10, and continuous with the wire 82 and the wire 86.

The impedance converter 1 includes a connection portion 70 that connects an end portion 84a and an end portion 85a. The end portion 84a is an end portion of the wire 84, located on the Ya side in the Y direction. The end portion 85a is an end portion of the wire 85, located on the Yb side in the Y direction. The connection portion 70 is formed by, for example, a conductor via. The conductor via penetrates the insulating layer 10 from the surface 10a, which is the one surface of the insulating layer 10, to the surface 10b, which is the other surface of the insulating layer 10, and is connected to the end portion 84a of the wire 84 and the end portion 85a of the wire 85.

A gap 91 is provided between the connection portion 71, which connects the end portion 81a of the wire 81 and the end portion 83a of the wire 83, and the end portion 85a of the wire 85 to which the connection portion 70 is connected. The connection portion 71 and the end portion 85a of the wire 85 are laid out such that the connection portion 71 and the end portion 85a are separated by the gap 91 on the surface 10a, which is the one surface of the insulating layer 10.

A gap 92 is provided between the connection portion 72, which connects the end portion 82a of the wire 82 and the end portion 86a of the wire 86, and the end portion 84a of the wire 84 to which the connection portion 70 is connected. The connection portion 72 and the end portion 84a of the wire 84 are laid out such that the connection portion 72 and the end portion 84a are separated by the gap 92 on the surface 10b, which is the other surface of the insulating layer 10.

An equivalent circuit diagram of the impedance converter 1 having a configuration as described above is as illustrated in FIG. 8. In the impedance converter 1, the wires 82, 84, and 86 are grounded, and the ungrounded wires 81, 83, and 85 are used as ports for signal input/output. For example, the wire 83 and the wire 85 are used as input ports, and the wire 81 is used as an output port in the impedance converter 1. For example, the wire 83 and the wire 85 are on the low-impedance side, and the wire 81 is on the high-impedance side in the impedance converter 1.

Note that in FIG. 8, an electronic element (circuit or part) connected to each port is represented as a resistance R for simplification.

In the impedance converter 1, when a signal is transmitted, the wire 83 and the wire 84 provided in such a way as to face each other via the insulating layer 10 are connected by an electromagnetic field coupling 102 (FIG. 8). In the impedance converter 1, when a signal is transmitted, the wire 85 and the wire 86 provided in such a way as to face each other via the insulating layer 10 are connected by an electromagnetic field coupling 103 (FIG. 8). In the impedance converter 1, when a signal is transmitted, the wire 81 and the wire 82 provided in such a way as to face each other via the insulating layer 10 are connected by an electromagnetic field coupling 101 (FIG. The wire 84 and the wire 85 are connected through the connection portion 70 (conductor via) as illustrated in FIG. 5 and the like.

In the impedance converter 1, a pair of the wires 83 and 84, in which the electromagnetic field coupling 102 occurs, and a pair of the wires 85 and 86, in which the electromagnetic field coupling 103 occurs, are laid out such that the pair of the wires 83 and 84 and the pair of the wires 85 and 86 both extend in the Y direction as illustrated in FIGS. 5 to 7. For example, the pair of wires 83 and 84 extends from the connection portion 71 and the connection portion 70 on the Ya side toward the Yb side opposite to the Ya side in the Y direction, and the pair of wires 85 and 86 extends from the connection portion 70 and the connection portion 72 on the Yb side toward the Ya side in the Y direction. In this example, it may also be said that the pair of wires 83 and 84, in which the electromagnetic field coupling 102 occurs, and the pair of wires 85 and 86, in which the electromagnetic field coupling 103 occurs, are laid out on the same straight line in a plan view. Then, a pair of the wires 81 and 82, in which the electromagnetic field coupling 101 occurs, extends in the X direction orthogonal to the Y direction.

As a result of adopting the layout as illustrated in FIGS. 5 to 7 in the impedance converter 1, it is possible to arrange the pair of wires 83 and 84, in which the electromagnetic field coupling 102 occurs, and the pair of wires 85 and 86, in which the electromagnetic field coupling 103 occurs, such that the pair of wires 83 and 84 and the pair of wires 85 and 86 are located sufficiently apart from each other. Moreover, it is also possible to arrange the pair of wires 83 and 84, in which the electromagnetic field coupling 102 occurs, and the pair of wires 85 and 86, in which the electromagnetic field coupling 103 occurs, sufficiently apart from the pair of wires 81 and 82, in which the electromagnetic field coupling 101 occurs.

As a result, it is possible to avoid occurrence of unnecessary electromagnetic field coupling between two of the wire 81, the wire 83, and the wire 85, that is, between the wire 83 and the wire 81 and between the wire 85 and the wire 81 as well as between the wire 83 and the wire 85. Similarly, it is possible to avoid occurrence of unnecessary electromagnetic field coupling between two of the wire 82, the wire 84, and the wire 86, that is, between the wire 84 and the wire 82 and between the wire 86 and the wire 82 as well as between the wire 84 and the wire 86. Furthermore, it is possible to avoid occurrence of unnecessary electromagnetic field coupling between the wire 83, the wire 86, and the wire 82, between the wire 85, the wire 84, and the wire 82, and between the wire 81, the wire 84, and the wire 86.

In the Guanella type impedance converter 1000 as described above with reference to FIGS. 1 to 4, the unnecessary electromagnetic field couplings 1104 and 1105 may occur between the wires 1083 and 1085 and between the wires 1084 and 1086 laid out in a C-shape, respectively, when a signal is transmitted. Furthermore, the unnecessary electromagnetic field couplings 1106 and 1107 may also occur between the wires 1083 and 1086 and between the wires 1084 and 1085, respectively. As a result, the characteristics of the impedance converter 1000 deteriorate.

As a result of integrally forming the ungrounded wires 1083 and 1085 in a C-shape, the wires 1083 and 1085 are connected to each other in the impedance converter 1000 described above. In contrast, the impedance converter 1 illustrated in FIGS. 5 to 8 has a converter structure in which the ungrounded wires 83 and 85 are not connected to each other and are located apart from each other. Then, in the impedance converter 1, the pair of wires 83 and 84 facing each other and the pair of wires 85 and 86 facing each other are laid out on the sides opposite to each other in the Y direction such that the pair of wires 83 and 84 and the pair of wires 85 and 86 extend to the Yb side and the Ya side, respectively. As a result, the pair of wires 83 and 84 and the pair of wires 85 and 86 are laid out sufficiently apart from each other. Therefore, occurrence of unnecessary electromagnetic field coupling that may occur in the impedance converter 1000 described above is avoided, so that the impedance converter 1 having excellent characteristics is implemented.

For example, a side where the pair of wires 83 and 84 and the pair of wires 85 and 86 are provided is set to the low-impedance side of an impedance of, for example, 12.3Ω or 25Ω, and a side where the pair of wires 81 and 82 is provided is set to the high-impedance side of an impedance of, for example, 50Ω in the impedance converter 1. For example, the wire 83 and the wire 85 are used as input ports, and the wire 81 is used as an output port in the impedance converter 1.

Signals input to the wire 83 and the wire 85 from electronic elements on the low-impedance side are transmitted through the wire 83 and the wire 84 connected by the electromagnetic field coupling 102, the wire 85 and the wire 86 connected by the electromagnetic field coupling 103, and the wire 81 and the wire 82 connected by the electromagnetic field coupling 101. Then, the transmitted signals are output from the wire 81 to an electronic element on the high-impedance side.

For example, a signal output from the electronic element on the low-impedance side is transmitted to the wire 83 connected by the electromagnetic field coupling 102 to the wire 84 connected in series to the wire 85 via the connection portion 70, and then transmitted to the wire 81 connected in series to the wire 83 via the connection portion 71. Furthermore, a signal output from the electronic element on the low-impedance side is transmitted to the wire 86 connected by the electromagnetic field coupling 103 to the wire 85 connected in series to the wire 84 via the connection portion 70, and then transmitted to the wire 82 connected in series to the wire 86 via the connection portion 72. Here, for example, signals output from the different electronic elements on the low-impedance side are transmitted to the wire 83 and the wire 85. Note that a signal output from a single electronic element on the low-impedance side may be branched and transmitted to the wire 83 and the wire 85. The signals are combined by the wire 81 and the wire 82 connected by the electromagnetic field coupling 101, and the combined signal is input from the wire 81 to the electronic element on the high-impedance side.

The impedance converter 1 matches the impedance on the low-impedance side (for example, 12.3Ω or 25Ω) with the impedance on the high-impedance side (for example, 50Ω). As a result of impedance matching performed by the impedance converter 1, the output from the electronic elements on the low-impedance side is efficiently input to the electronic element on the high-impedance side while reflection is reduced.

Assume that the frequencies of signals to be transmitted in the impedance converter 1 range from, for example, $F_L$ to $F_H$. In this case, with respect to a center frequency $F_C$ ($F_L+F_H/2$), the length of each of the pair of wires 81 and 82, the pair of wires 83 and 84, and the pair of wires 85 and 86 may be set to ⅛ of a wavelength. Furthermore, it is also possible to set the length of the pair of wires 81 and 82 to ¼ of a wavelength and set the length of each of the pair of wires 83 and 84 and the pair of wires 85 and 86 to ⅛ of a wavelength, with respect to the center frequency $F_C$.

Next, an application example of the impedance converter 1 will be described.

Figure 9:
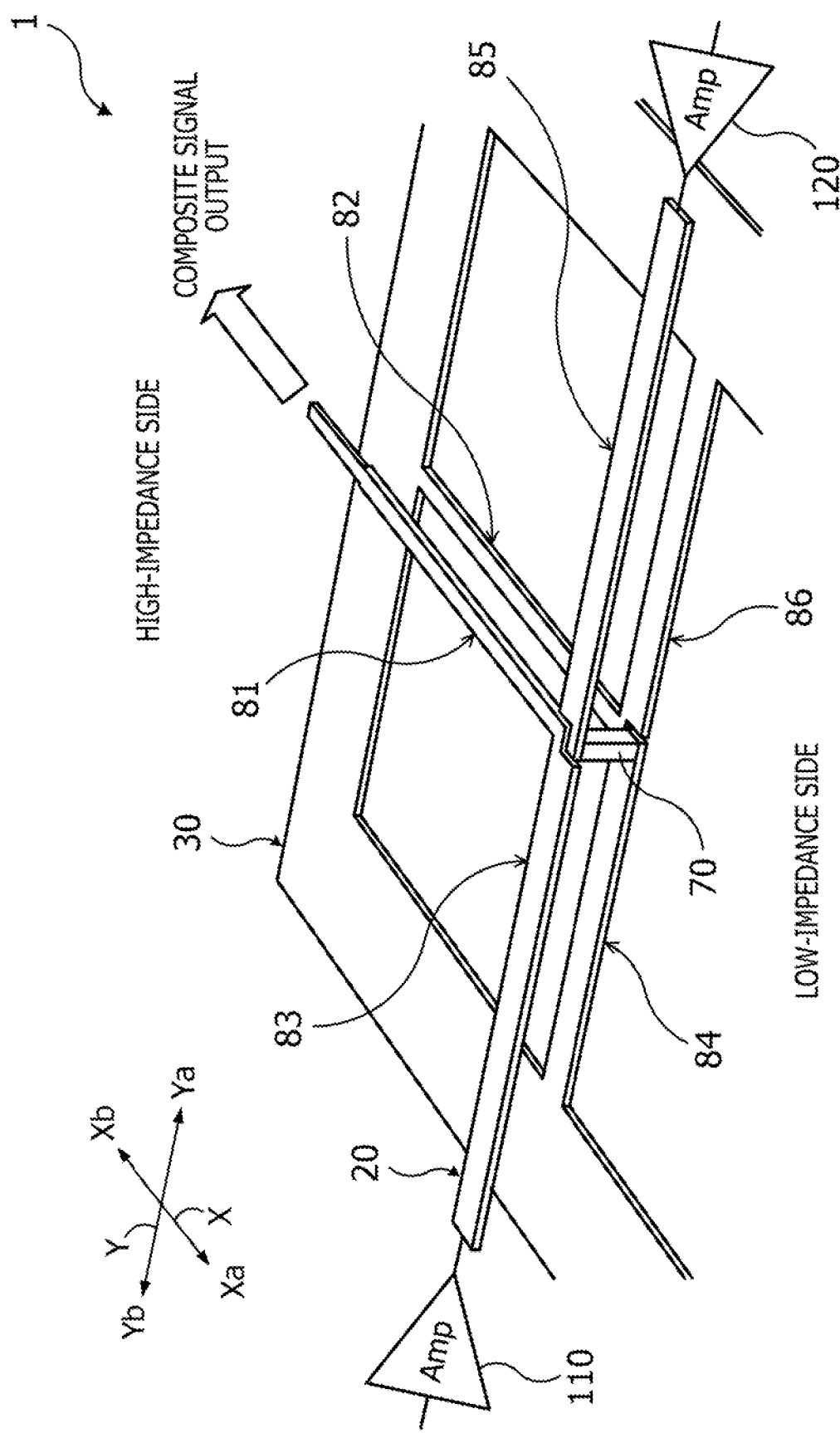
FIG. 9 is a diagram describing an application example of the impedance converter according to the first embodiment.

FIG. 9 is a diagram describing an application example of the impedance converter according to the first embodiment. FIG. 9 is a schematic perspective view of a main part of the impedance converter cited as the example.

For example, the wire 83 and the wire 85 on the low-impedance side are used as input ports, and the wire 81 on the high-impedance side is used as an output port in the impedance converter 1 (FIGS. 5 to 8). The impedance converter 1 differs from the impedance converter 1000 described above (FIGS. 1 to 4) including a single input port in that an input port on the low-impedance side is divided into the two wires 83 and 85.

Since the input port of the impedance converter 1 is divided into two in this way, it is possible to connect an electronic element to each of the wire 83 which is one of the input ports and the wire 85 which is the other input port. For example, when the impedance converter 1 is applied to a power amplifier, an amplifier 110 and an amplifier 120 are connected to the wire 83 and the wire 85 serving as input ports, respectively, as illustrated in FIG. 9. An amplifier element such as a HEMT formed by use of GaN, or an amplifier circuit including such an amplifier element is used for the amplifier 110 and the amplifier 120.

In the impedance converter 1, a signal output from the amplifier 110 and a signal output from the amplifier 120 are input to the wire 83 and the wire 85, respectively. The signals output from the amplifier 110 and the amplifier 120 are transmitted through the wire 83 and the wire 84 connected by the electromagnetic field coupling 102, the wire 85 and the wire 86 connected by the electromagnetic field coupling 103, and the wire 81 and the wire 82 connected by the electromagnetic field coupling 101. The signals output from the amplifier 110 and the amplifier 120 are transmitted through the impedance converter 1, where the signals are impedance-matched and combined. Then, the combined signal (composite signal) is output from the wire 81.

The impedance converter 1 with the input port divided into two enables generation of a composite signal and combined power that are difficult to generate in the above-described impedance converter 1000 with a single input port.

Note that an example of connecting the amplifier 110 and the amplifier 120 to the wire 83 and the wire 85 serving as the input ports of the impedance converter 1, respectively, has been cited here, while not only amplifiers but also various electronic elements may be connected to the wire 83 and the wire 85.

For example, an antenna may be connected to the wire 81 serving as the output port of the impedance converter 1 applied to the power amplifier. Meanwhile, not only an antenna but also various electronic elements may be connected to the wire 81.

The impedance converter 1 may be used for combining outputs of a group of various electronic elements connected to the wire 83 and the wire 85 serving as the input ports, and for impedance matching between the group of electronic elements and an electronic element connected to the wire 81 serving as the output port.

Next, an example of the result of analyzing characteristics of the impedance converter 1 will be described.

Figure 10:
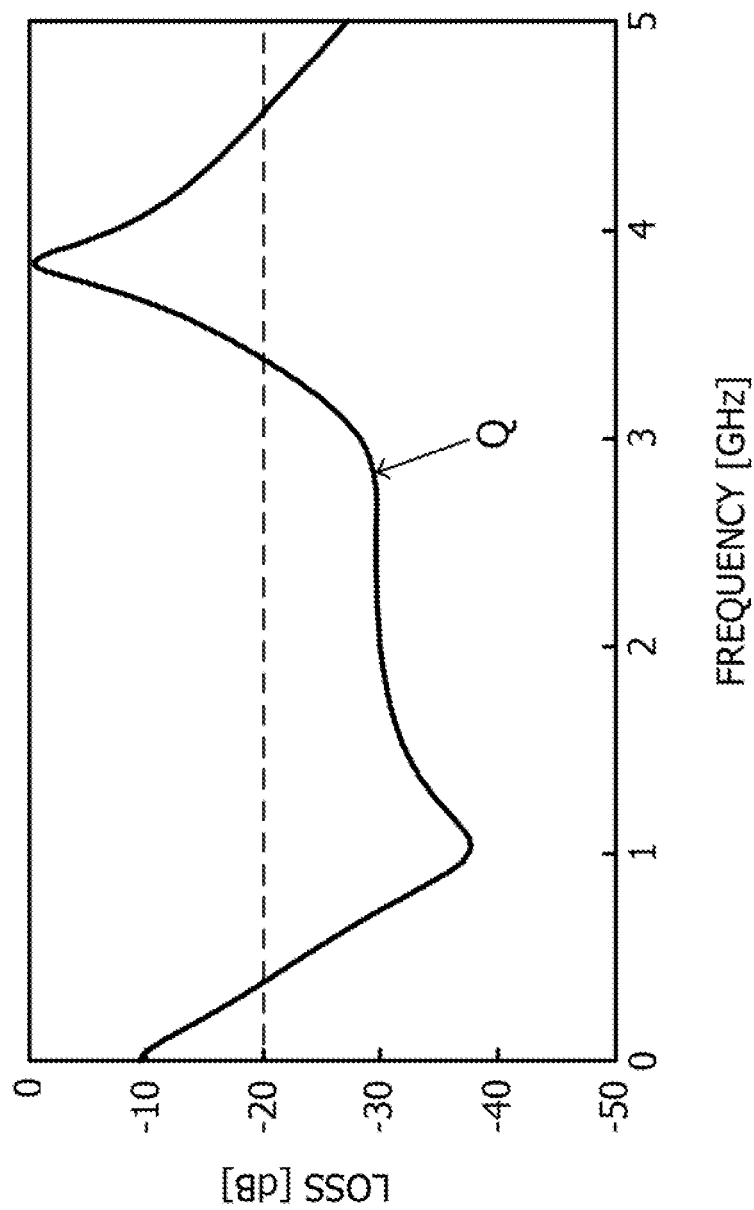
FIG. 10 is a diagram illustrating an example of the result of electromagnetic field analysis of the impedance converter according to the first embodiment.

FIG. 10 is a diagram illustrating an example of the result of electromagnetic field analysis of the impedance converter according to the first embodiment.

FIG. 10 illustrates the result of simulation analysis (electromagnetic field analysis) of reflection characteristics of the impedance converter 1 having the configuration as described above, viewed from the wire 81 serving as the output port. In FIG. 10, the horizontal axis represents frequency [GHz], and the vertical axis represents reflection loss [dB], As represented by a solid line Q in FIG. 10, it has been confirmed that good reflection characteristics with a reflection loss of −20 dB or less are obtained in the range of 0.4 GHz to 3.4 GHz.

Next, a configuration example of an electronic device including the impedance converter 1 will be described.

Figure 11:
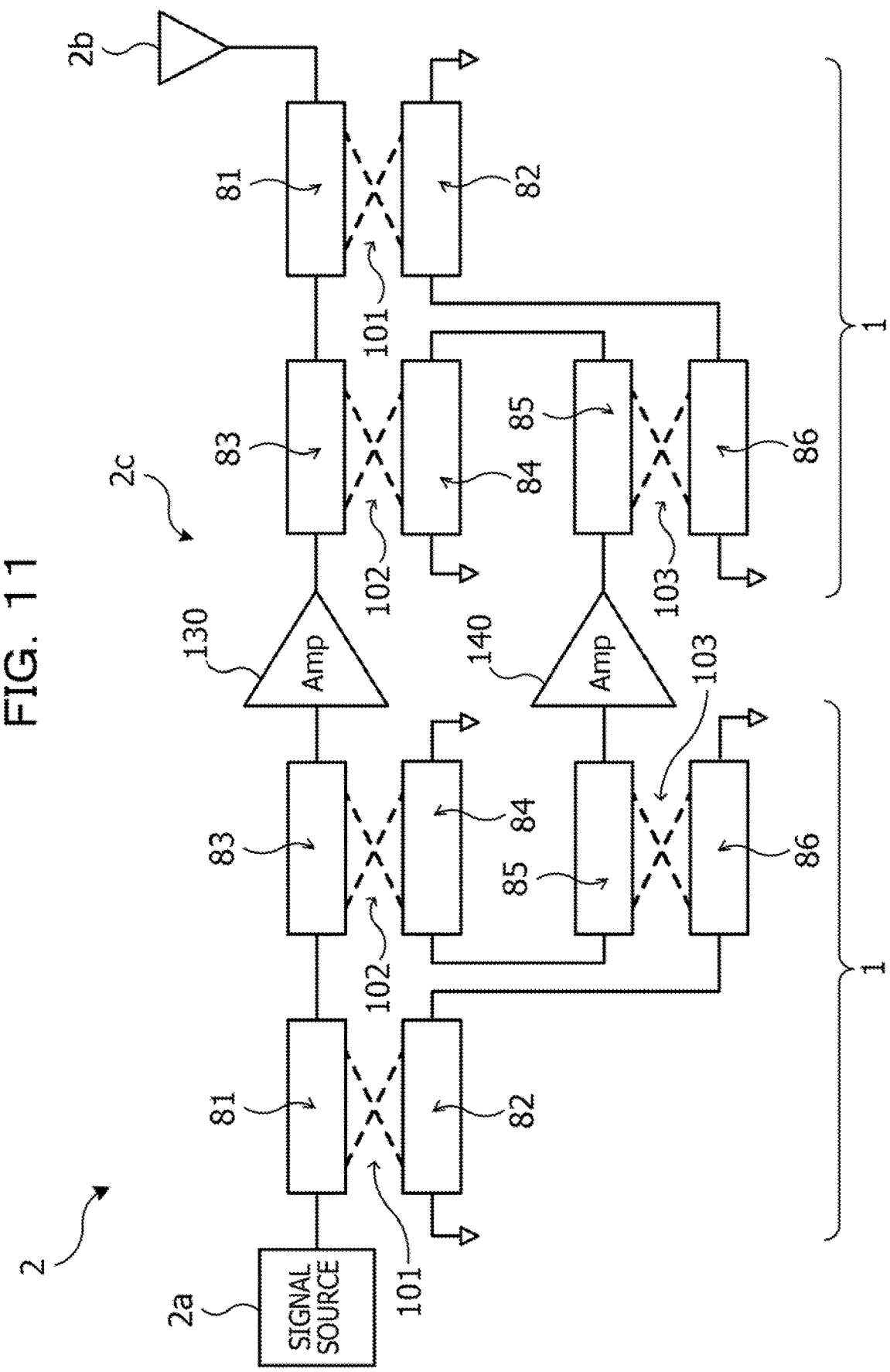
FIG. 11 is a diagram describing a first configuration example of an electronic device including the impedance converter according to the first embodiment.

FIG. 11 is a diagram describing a first configuration example of an electronic device including the impedance converter according to the first embodiment.

A transmitter 2 including a signal source 2a, an antenna 2b, and a power amplifier 2c provided therebetween is illustrated in FIG. 11. In the transmitter 2, a signal output from the signal source 2a is amplified by the power amplifier 2c, and the amplified signal is output (emitted or transmitted) from the antenna 2b. The power amplifier 2c includes two amplifiers 130 and 140 and the impedance converters 1 connected to the input and output stages of the amplifiers 130 and 140, respectively. The impedance converters 1 having a configuration as described above with reference to FIGS. 5 to 8 are used for the power amplifier 2c.

In the transmitter 2, the wire 81 is used as an input port, and the wire 83 and the wire 85 are used as output ports for the impedance converter 1 connected to the input stages of the amplifier 130 and the amplifier 140. The signal source 2a is connected to the wire 81 serving as the input port. The amplifier 130 is connected to the wire 83 serving as one of the output ports. The amplifier 140 is connected to the wire 85 serving as the other output port.

A signal output from the signal source 2a is input to the wire 81 and distributed to the wire 82 provided in such a way as to face the wire 81 and connected by the electromagnetic field coupling 101. The signal input from the signal source 2a to the wire 81 is input to the amplifier 130 through the wire 83 connected to the wire 81 and connected by the electromagnetic field coupling 102 to the wire 84 connected in series to the wire 85. The signal distributed from the wire 81 to the wire 82 is input to the amplifier 140 through the wire 85 connected in series to the wire 84 and connected by the electromagnetic field coupling 103 to the wire 86 connected to the wire 82.

In the transmitter 2, the wire 83 and the wire 85 are used as input ports, and the wire 81 is used as an output port for the impedance converter 1 connected to the output stages of the amplifier 130 and the amplifier 140. The amplifier 130 is connected to the wire 83 serving as one of the input ports. The amplifier 140 is connected to the wire 85 serving as the other input port. The antenna 2b is connected to the wire 81 serving as the output port.

A signal output from the amplifier 130 is transmitted to the wire 81 through the wire 83 connected by the electromagnetic field coupling 102 to the wire 84 connected in series to the wire 85. A signal output from the amplifier 140 is transmitted to the wire 82 through the wire 86 connected by the electromagnetic field coupling 103 to the wire 85 connected in series to the wire 84. The signals from the amplifier 130 and the amplifier 140 are combined by the wire 81 and the wire 82 connected by the electromagnetic field coupling 101, and the combined signal is output from the wire 81 to the antenna 2b.

According to the transmitter 2, it is possible to distribute the output from the single signal source 2a to the two amplifiers 130 and 140 by using the impedance converter 1, combine signals amplified by the amplifiers 130 and 140 by using the impedance converter 1, and supply the combined signal to the antenna 2b. As illustrated in the transmitter 2, the impedance converter 1 may also be used as a power divider.

Figure 12:
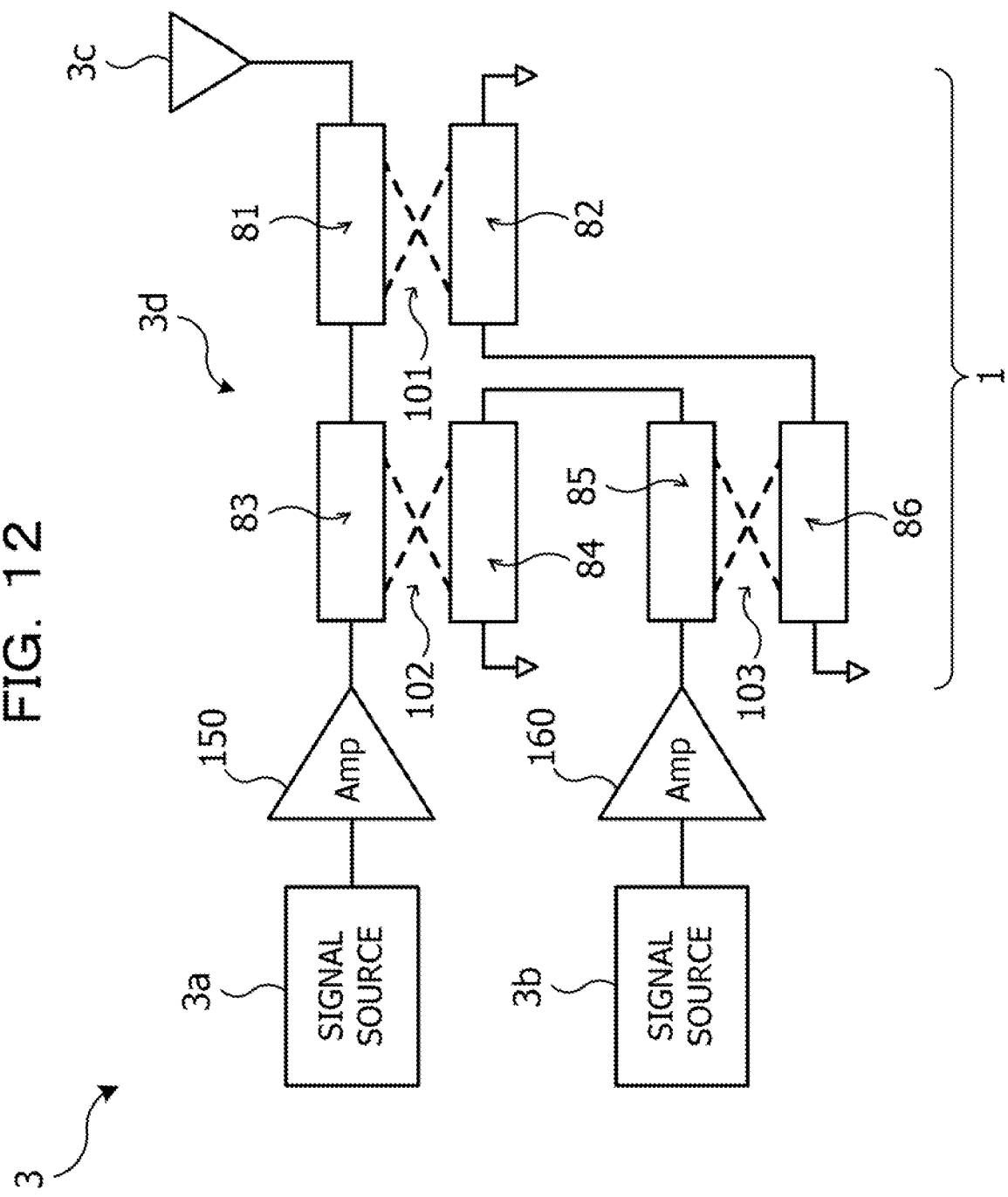
FIG. 12 is a diagram describing a second configuration example of the electronic device including the impedance converter according to the first embodiment.

Furthermore, FIG. 12 is a diagram describing a second configuration example of the electronic device including the impedance converter according to the first embodiment.

A transmitter 3 including two signal sources 3a and 3b, an antenna 3c, and a power amplifier 3d provided between the signal sources 3a and 3b and the antenna 3c is illustrated in FIG. 12. In the transmitter 3, signals output from the signal source 3a and the signal source 3b are amplified and combined by the power amplifier 3d, and the combined signal is output (emitted or transmitted) from the antenna 3c. The power amplifier 3d includes two amplifiers 150 and 160 and the impedance converter 1 connected to the output stages of the amplifiers 150 and 160. The impedance converter 1 having a configuration as described above with reference to FIGS. 5 to 8 is used for the power amplifier 3d.

In the transmitter 3, the signal source 3a and the signal source 3b are connected to the input stages of the amplifier 150 and the amplifier 160, respectively. In the impedance converter 1 connected to the output stages of the amplifier 150 and the amplifier 160, the wire 83 and the wire 85 are used as input ports, and the wire 81 is used as an output port. The amplifier 150 is connected to the wire 83 serving as one of the input ports. The amplifier 160 is connected to the wire 85 serving as the other input port. The antenna 3c is connected to the wire 81 serving as the output port.

A signal output from the signal source 3a is input to the amplifier 150 and amplified. A signal output from the signal source 3b is input to the amplifier 160 and amplified. The signal amplified by the amplifier 150 is transmitted to the wire 81 through the wire 83 connected by the electromagnetic field coupling 102 to the wire 84 connected in series to the wire 85. The signal amplified by the amplifier 160 is transmitted to the wire 82 through the wire 86 connected by the electromagnetic field coupling 103 to the wire 85 connected in series to the wire 84. The signals from the amplifier 150 and the amplifier 160 are combined by the wire 81 and the wire 82 connected by the electromagnetic field coupling 101, and the combined signal is output from the wire 81 to the antenna 3c.

According to the transmitter 3, it is possible to amplify the outputs from the two signal sources 3a and 3b by means of the two amplifiers 150 and 160, respectively, combine the amplified signals by using the impedance converter 1, and supply the combined signal to the antenna 3c.

Second Embodiment

Figure 13:
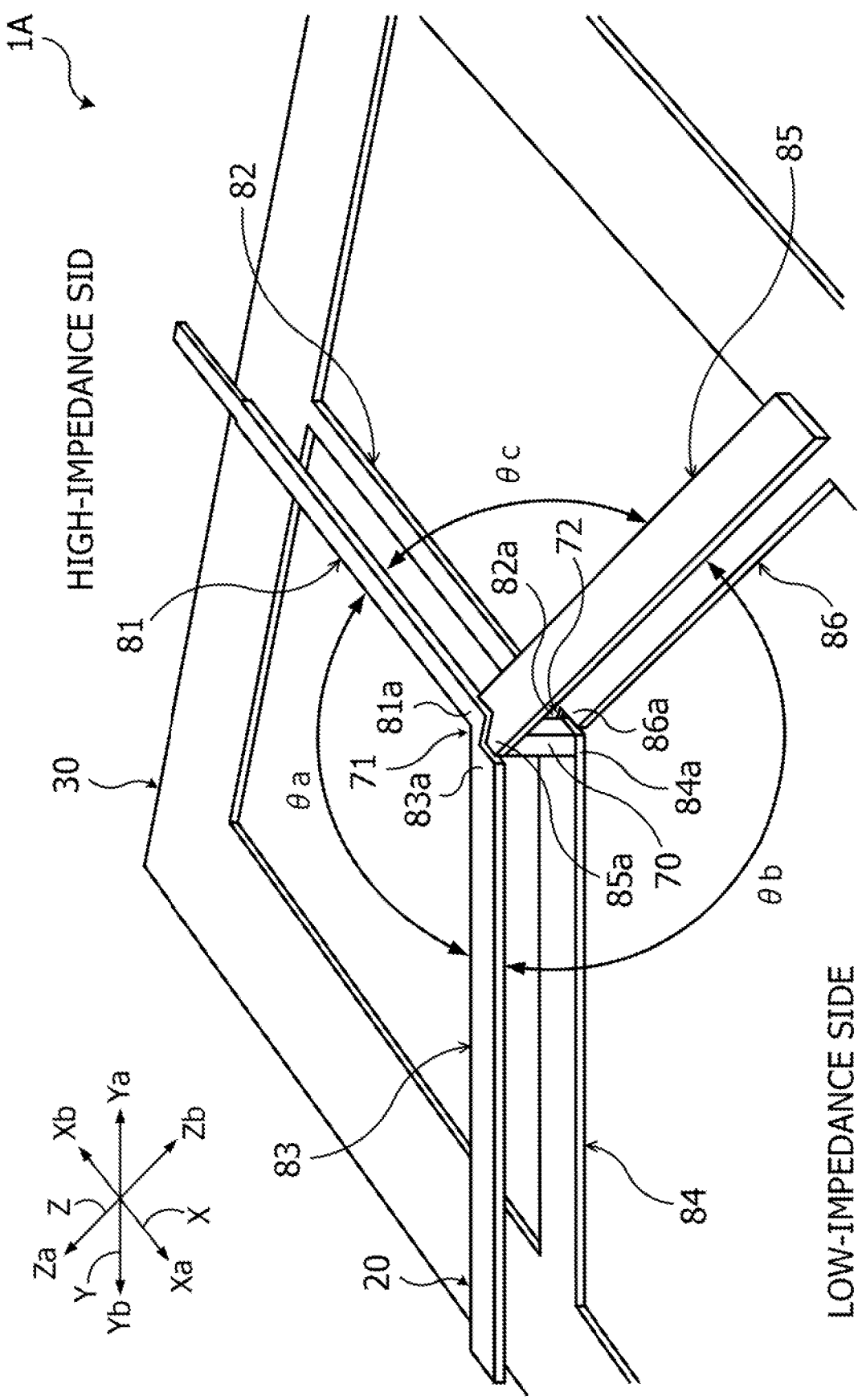
FIG. 13 is a diagram describing an example of an impedance converter according to a second embodiment.

FIG. 13 is a diagram describing an example of an impedance converter according to a second embodiment. FIG. 13 is a schematic perspective view of a main part of the impedance converter cited as the example.

An impedance converter 1A illustrated in FIG. 13 has a configuration in which a pair of wires 81 and 82 extends in an X direction in a plan view. Moreover, the impedance converter 1A is also configured such that a pair of wires 83 and 84 extends in a Y direction orthogonal to the X direction in a plan view and a pair of wires 85 and 86 extends in a Z direction orthogonal to the X and Y directions in a plan view.

The impedance converter 1A includes a connection portion 71 that connects an end portion 81a and an end portion 83a. The end portion 81a is an end portion of the wire 81, located on an Xa side in the X direction. The end portion 83a is an end portion of the wire 83, located on a Ya side in the Y direction. The connection portion 71 is formed by, for example, a conductor layer continuous with the wire 81 and the wire 83.

The impedance converter 1A includes a connection portion 72 that connects an end portion 82a and an end portion 86a. The end portion 82a is an end portion of the wire 82, located on the Xa side in the X direction. The end portion 86a is an end portion of the wire 86, located on a Za side in the Z direction. The connection portion 72 is formed by, for example, a conductor layer continuous with the wire 82 and the wire 86.

The impedance converter 1A includes a connection portion 70 that connects an end portion 84a and an end portion 85a. The end portion 84a is an end portion of the wire 84, located on the Ya side in the Y direction. The end portion 85a is an end portion of the wire 85, located on the Za side in the Z direction. The connection portion 70 is formed by, for example, a conductor via connected to the end portion 84a of the wire 84 and the end portion 85a of the wire 85.

In the impedance converter 1A, a layout is adopted in which an angle θa between the pair of wires 81 and 82 and the pair of wires 83 and 84 is obtuse in a plan view. Moreover, in the impedance converter 1A, a layout is adopted in which an angle θb between the pair of wires 83 and 84 and the pair of wires 85 and 86 is obtuse in a plan view. Furthermore, in the impedance converter 1A, a layout is adopted in which an angle θc between the pair of wires 85 and 86 and the pair of wires 81 and 82 is obtuse in a plan view. As long as the angle θa, the angle θb, and the angle θc are all obtuse, all the three may be different angles, two of the three may be the same angle, or all the three may be the same angle.

The impedance converter 1A is different from the impedance converter 1 described above in the first embodiment in that the impedance converter 1A has a configuration including such a layout.

The equivalent circuit diagram of the impedance converter 1A is the same as the equivalent circuit diagram of the impedance converter 1 described above in the first embodiment, illustrated in FIG. 8.

For the sake of convenience, an insulating layer (corresponding to the insulating layer 10 illustrated in FIGS. 6A, 6B, and 7 described above) provided between a conductor layer 20 including the wires 81, 83, and 85 and a conductor layer 30 including the wires 82, 84, and 86 is not illustrated in FIG. 13.

As in the impedance converter 1 described above, it is also possible to arrange the pair of wires 83 and 84, in which an electromagnetic field coupling 102 occurs, and the pair of wires 85 and 86, in which an electromagnetic field coupling 103 occurs, such that the pair of wires 83 and 84 and the pair of wires 85 and 86 are located sufficiently apart from each other in the impedance converter 1A in which the layout illustrated in FIG. 13 has been adopted. Moreover, in the impedance converter 1A, it is also possible to arrange the pair of wires 83 and 84, in which the electromagnetic field coupling 102 occurs, and the pair of wires 85 and 86, in which the electromagnetic field coupling 103 occurs, sufficiently apart from the pair of wires 81 and 82, in which an electromagnetic field coupling 101 occurs.

As a result, it is possible to avoid occurrence of unnecessary electromagnetic field coupling between two of the wire 81, the wire 83, and the wire 85, that is, between the wire 83 and the wire 81 and between the wire 85 and the wire 81 as well as between the wire 83 and the wire 85. Similarly, it is possible to avoid occurrence of unnecessary electromagnetic field coupling between two of the wire 82, the wire 84, and the wire 86, that is, between the wire 84 and the wire 82 and between the wire 86 and the wire 82 as well as between the wire 84 and the wire 86. Furthermore, it is possible to avoid occurrence of unnecessary electromagnetic field coupling between the wire 83, the wire 86, and the wire 82, between the wire 85, the wire 84, and the wire 82, and between the wire 81, the wire 84, and the wire 86.

The impedance converter 1A that enables occurrence of unnecessary electromagnetic field coupling to be avoided and has excellent characteristics is implemented.

For example, a side where the pair of wires 83 and 84 and the pair of wires 85 and 86 are provided is set to the low-impedance side of an impedance of, for example, 12.5Ω or 25Ω, and a side where the pair of wires 81 and 82 is provided is set to the high-impedance side of an impedance of, for example, 50Ω in the impedance converter 1A. For example, the wire 83 and the wire 85 are used as input ports, and the wire 81 is used as an output port in the impedance converter 1A.

Signals input to the wire 83 and the wire 85 from electronic elements on the low-impedance side are transmitted through the wire 83 and the wire 84 connected by the electromagnetic field coupling 102, the wire 85 and the wire 86 connected by the electromagnetic field coupling 103, and the wire 81 and the wire 82 connected by the electromagnetic field coupling 101. Then, the transmitted signals are output from the wire 81 to an electronic element on the high-impedance side.

The impedance converter 1A matches the impedance on the low-impedance side (for example, 12.5Ω or 25Ω) with the impedance on the high-impedance side (for example, 50Ω). As a result of impedance matching performed by the impedance converter 1A, the output from the electronic elements on the low-impedance side is efficiently input to the electronic element on the high-impedance side while reflection is reduced.

Assume that the frequencies of signals to be transmitted in the impedance converter 1A range from, for example, $F_L$ to $F_H$. In this case, with respect to a center frequency $F_C$ $(F_L+F_H)/2)$, the length of each of the pair of wires 81 and 82, the pair of wires 83 and 84, and the pair of wires 85 and 86 may be set to ⅛ of a wavelength. Furthermore, it is also possible to set the length of the pair of wires 81 and 82 to ¼ of a wavelength and set the length of each of the pair of wires 83 and 84 and the pair of wires 85 and 86 to ⅛ of a wavelength, with respect to the center frequency $F_C$.

Various electronic elements may be respectively connected to the wire 81, the wire 83, and the wire 85, which serve as the input/output ports of the impedance converter 1k and the impedance converter 1A may be used for impedance matching between the various electronic elements.

The impedance converter 1A may be applied to various electronic devices.

For example, the impedance converter 1A may be applied to the power amplifier 2c provided between the single signal source 2a and the antenna 2b of the transmitter 2 according to the example of FIG. 11 described above. For example, in the power amplifier 2c of the transmitter 2 illustrated in FIG. 11 described above, the impedance converter 1A described in the second embodiment is used instead of the impedance converter 1 described in the first embodiment. The impedance converters 1A are provided in the input and output stages of the two amplifiers 130 and 140, and output from the single signal source 2a is distributed to the two amplifiers 130 and 140 by use of the impedance converter 1A.

Then, signals amplified by the two amplifiers 130 and 140 are combined by use of the impedance converter 1A and supplied to the antenna 2b.

Furthermore, the impedance converter 1A may also be applied to the power amplifier 3d provided between the two signal sources 3a and 3b and the antenna 3c of the transmitter 3 according to the example of FIG. 12 described above. For example, in the power amplifier 3d of the transmitter 3 illustrated in FIG. 12 described above, the impedance converter 1A described in the second embodiment is used instead of the impedance converter 1 described in the first embodiment. The signal source 3a and the signal source 3b are connected to the input stages of the amplifiers 150 and the amplifier 160, respectively, and the impedance converter 1A is provided in the output stages of the two amplifiers 150 and 160. Outputs from the signal source 3a and the signal source 3b are amplified by the amplifier 150 and the amplifier 160. Then, the amplified outputs are combined by use of the impedance converter 1A and supplied to the antenna 3c.

As described above, the impedance converter 1A may be applied to various electronic devices such as a power amplifier and a transmitter including a power amplifier.

Third Embodiment

Here, an example of an electronic device including an impedance converter will be described as a third embodiment.

Figure 14A:
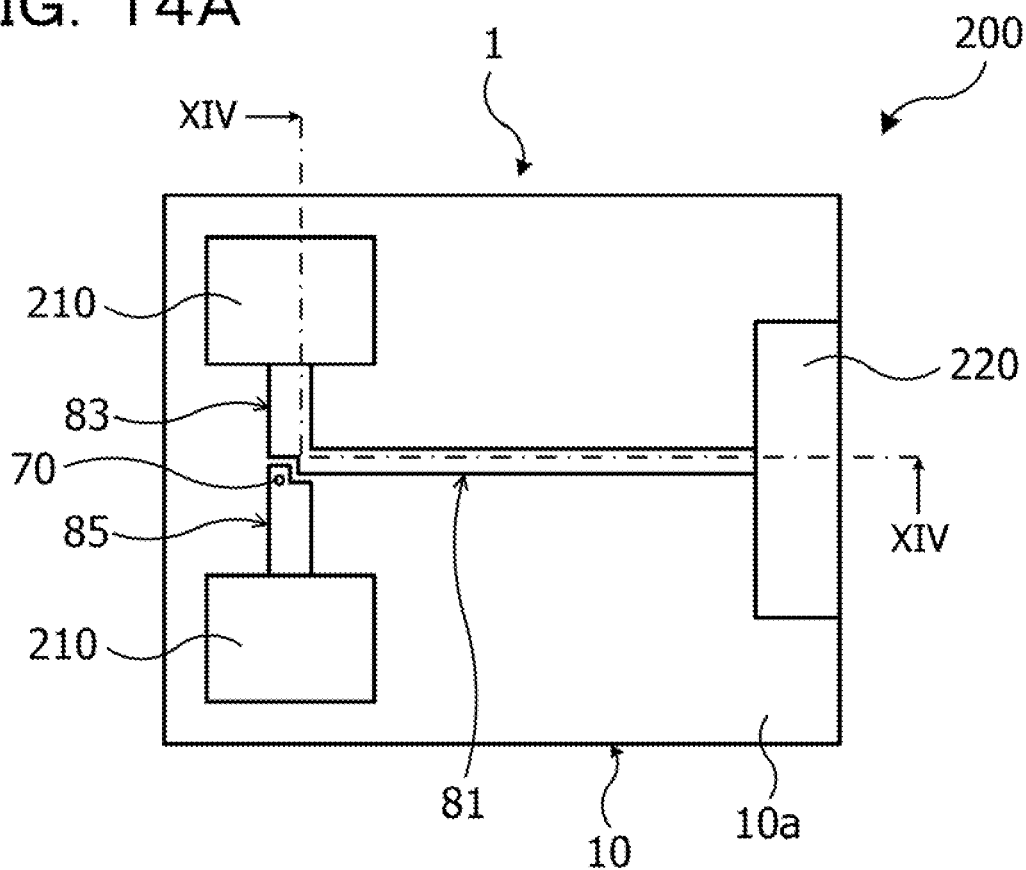
Figure 14B:
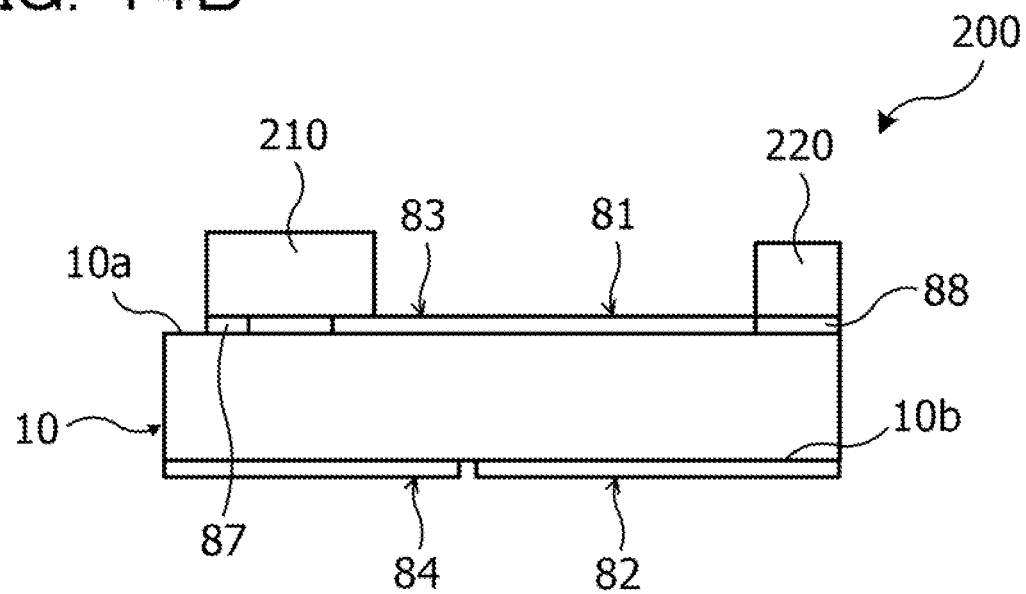

FIGS. 14A and 14B are diagrams describing a first example of the electronic device according to the third embodiment. FIG. 14A is a schematic plan view of a main part of the electronic device cited as the example. FIG. 14B is a schematic cross-sectional view of the electronic device taken along line XIV-XIV in FIG. 14A.

As an example, an electronic device 200 illustrated in FIGS. 14A and 14B includes the impedance converter 1 described above in the first embodiment. The electronic device 200 further includes a group of semiconductor chips 210 (two in this example) mounted on the impedance converter 1 and a chip antenna 220 mounted on the impedance converter 1. The electronic device 200 illustrated in FIGS. 14A and 14B is a form of a transmitter.

As described above in the first embodiment, the pair of wires 81 and 82, the pair of wires 83 and 84, and the pair of wires 85 and 86 are provided on the insulating layer 10 in the impedance converter 1. As illustrated in FIG. 14B, a wire 87 and a wire 88 are further provided on the insulating layer 10. The wire 87 is provided in a region where the group of semiconductor chips 210 is mounted. The wire 88 is provided in a region where the chip antenna 220 is mounted.

For example, a semiconductor chip that includes an amplifier element such as a HEMT formed by use of GaN or an amplifier circuit including such an amplifier element is used for the group of semiconductor chips 210. One of the group of semiconductor chips 210 is mounted on the impedance converter 1 in such a way as to be connected to the wire 83 serving as one of input ports of the impedance converter 1 and the wire 87 provided on the insulating layer 10 together with the wire 83. Similarly, the other one of the group of semiconductor chips 210 is mounted on the impedance converter 1 in such a way as to be connected to the wire 85 serving as the other input port of the impedance converter 1 and a wire provided on the insulating layer 10 together with the wire 85.

The group of semiconductor chips 210 may be mounted on the impedance converter 1 by, for example, flip-chip bonding using bumps or layers of solder or the like. In addition, the group of semiconductor chips 210 may also be mounted on the impedance converter 1 by wire bonding using wire (not illustrated).

The chip antenna 220 includes an antenna that transmits a predetermined frequency signal. The chip antenna 220 is mounted on the impedance converter 1 in such a way as to be connected to the wire 88 connected to the wire 81 serving as the output port of the impedance converter 1.

The chip antenna 220 may be mounted on the impedance converter 1 by use of, for example, bumps or layers of solder or the like. In addition, the chip antenna 220 may also be mounted on the impedance converter 1 by use of wire (not illustrated).

As described above, the electronic device 200 has a configuration in which the group of semiconductor chips 210 and the chip antenna 220 are mounted on the impedance converter 1.

In the electronic device 200, signals amplified by the group of semiconductor chips 210 are combined and impedance-matched by use of the impedance converter 1, supplied to the chip antenna 220, and output (emitted or transmitted) from the chip antenna 220. The pair of wires 83 and 84, the pair of wires 85 and 86, and the pair of wires 81 and 82 laid out as described above in the first embodiment are provided on the impedance converter 1 of the electronic device 200. As a result, the impedance converter 1 that enables occurrence of unnecessary electromagnetic field coupling to be avoided and has excellent characteristics is implemented. The impedance converter 1 as described above is used to implement the electronic device 200 with high performance and high quality.

According to the example illustrated in FIGS. 14A and 14B, it is possible to obtain the electronic device 200 capable of implementing a part of the function of the transmitter 2 having a configuration as illustrated in FIG. 11 described above, or the electronic device 200 capable of implementing the function of the transmitter 3 having a configuration as illustrated in FIG. 12 described above.

Here, an example has been cited in which the group of semiconductor chips 210 and the chip antenna 220 are mounted on the impedance converter 1, while other electronic elements (semiconductor chips, chip parts, circuits, and the like) may be further mounted on the impedance converter 1.

Here, an example in which the chip antenna 220 is mounted on the impedance converter 1 has been cited. However, instead of mounting the chip antenna 220, it is also possible to form an antenna pattern that is connected to the wire 81 and functions as an antenna, on the insulating layer 10 of the impedance converter 1.

Here, the electronic device 200 using the impedance converter 1 has been cited as an example. In addition, it is also possible to implement an electronic device by using the impedance converter 1A described above in the second embodiment and mounting the group of semiconductor chips 210 and the chip antenna 220 or forming an antenna pattern on the impedance converter 1A.

Figure 15A:
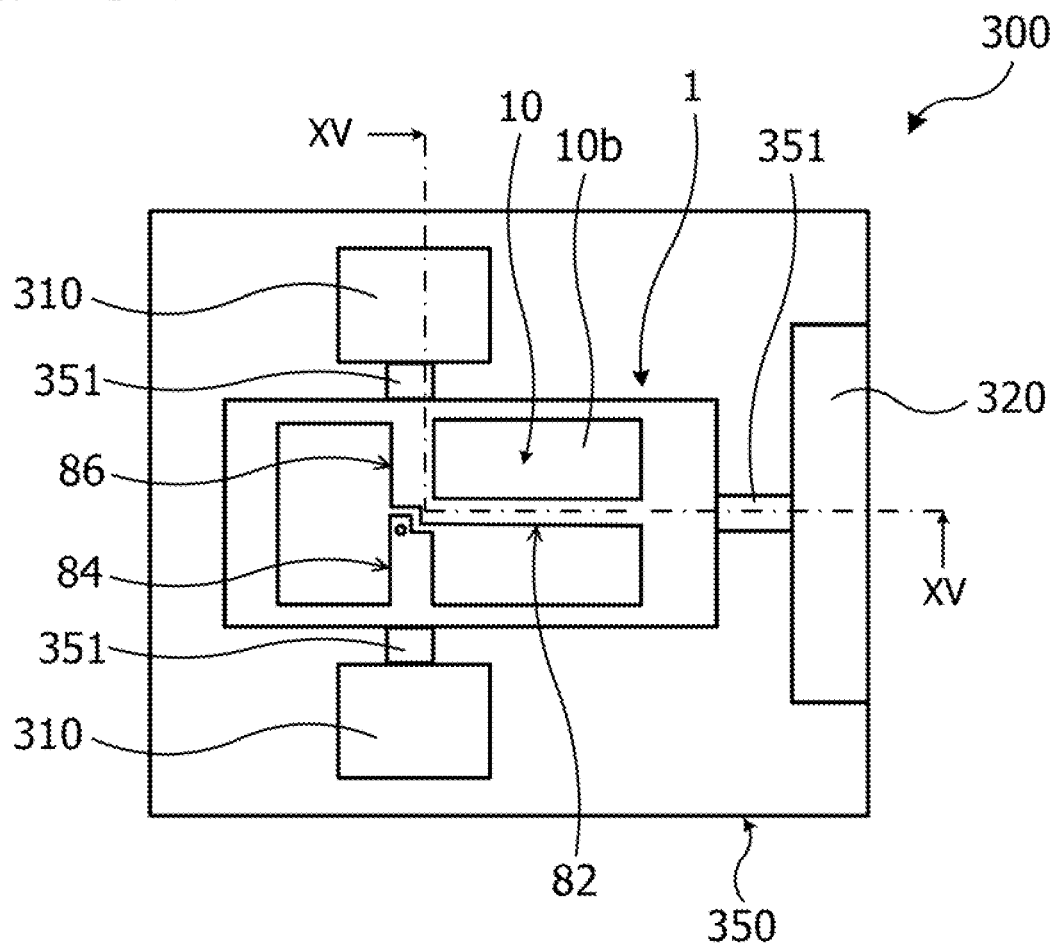
Figure 15B:
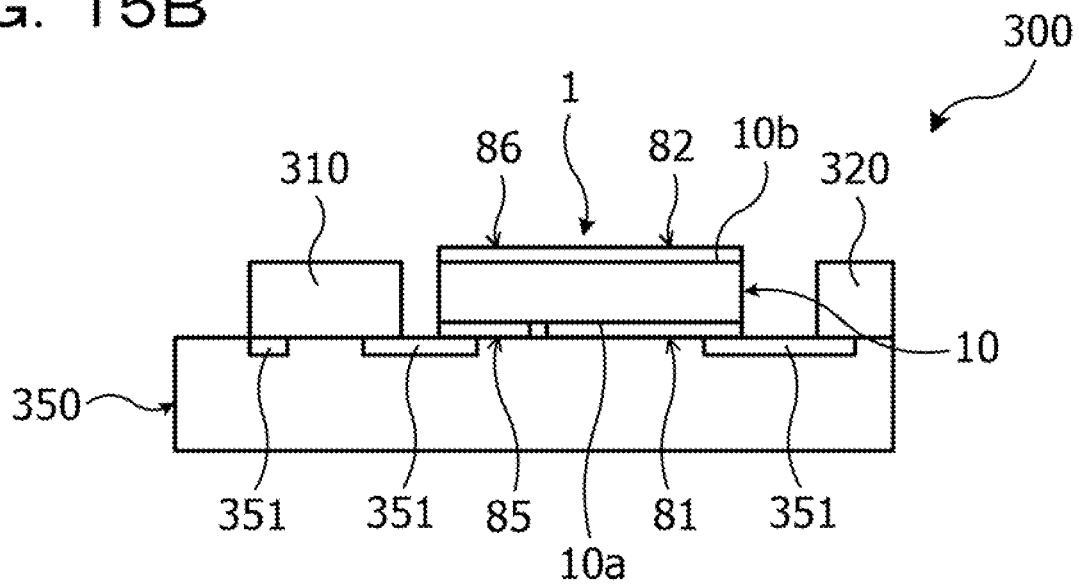

Furthermore, FIGS. 15A and 15B are diagrams describing a second example of the electronic device according to the third embodiment. FIG. 15A is a schematic plan view of a main part of the electronic device cited as the example. FIG. 15B is a schematic cross-sectional view of the electronic device taken along line XV-XV in FIG. 15A.

An electronic device 300 illustrated in FIGS. 15A and 15B includes a circuit board 350. The electronic device 300 further includes the impedance converter 1 described above in the first embodiment, a group of semiconductor chips 310 (two in this example), and a chip antenna 320 that are mounted on the circuit board 350. The electronic device 300 illustrated in FIGS. 15A and 15B is a form of a transmitter.

A wiring pattern 351 is provided on the circuit board 350. The wiring pattern 351 is patterned in a predetermined shape in such a way as to be connected to the impedance converter 1, the group of semiconductor chips 310, and the chip antenna 320 mounted on the circuit board 350. The impedance converter 1, the group of semiconductor chips 310, and the chip antenna 320 are mounted in such a way as to be connected to a predetermined part of the wiring pattern 351 provided on the circuit board 350. One of the group of semiconductor chips 310 and the wire 83 (not illustrated) serving as one of the input ports of the impedance converter 1 are connected through the wiring pattern 351 of the circuit board 350. The other one of the group of semiconductor chips 310 and the wire 85 serving as the other input port of the impedance converter 1 are connected through the wiring pattern 351 of the circuit board 350. The chip antenna 320 and the wire 81 serving as the output port of the impedance converter 1 are connected through the wiring pattern 351 of the circuit board 350.

The impedance converter 1, the group of semiconductor chips 310, and the chip antenna 320 may be mounted on the circuit board 350 by use of, for example, bumps or layers of solder or the like. In addition, the impedance converter 1, the group of semiconductor chips 310, and the chip antenna 320 may also be mounted on the circuit board 350 by use of wire (not illustrated).

As described above, the electronic device 300 has a configuration in which the impedance converter 1, the group of semiconductor chips 310, and the chip antenna 320 are mounted on the circuit board 350.

In the electronic device 300, signals amplified by the group of semiconductor chips 310 are combined and impedance-matched by use of the impedance converter 1, supplied to the chip antenna 320, and output (emitted or transmitted) from the chip antenna 320. The pair of wires 83 and 84, the pair of wires 85 and 86, and the pair of wires 81 and 82 laid out as described above in the first embodiment are provided on the impedance converter 1 of the electronic device 300. As a result, the impedance converter 1 that enables occurrence of unnecessary electromagnetic field coupling to be avoided and has excellent characteristics is implemented. The impedance converter 1 as described above is used to implement the electronic device 300 with high performance and high quality.

It is also possible to obtain the electronic device 300 capable of implementing a part of the function of the transmitter 2 having a configuration as illustrated in FIG. 1 described above, or the electronic device 300 capable of implementing the function of the transmitter 3 having a configuration as illustrated in FIG. 12 described above, according to the example illustrated in FIGS. 15A and 15B.

Here, an example has been cited in which the impedance converter 1, the group of semiconductor chips 310, and the chip antenna 320 are mounted on the circuit board 350, while other electronic elements (semiconductor chips, chip parts, circuits, and the like) may be further mounted on the circuit board 350.

Here, an example in which the chip antenna 320 is mounted on the circuit board 350 has been cited. However, instead of mounting the chip antenna 320, it is also possible to form an antenna pattern that functions as an antenna on the circuit board 350.

Here, the electronic device 300 using the impedance converter 1 has been cited as an example. In addition, it is also possible to implement an electronic device by using the impedance converter 1A described above in the second embodiment and mounting the impedance converter 1A, the group of semiconductor chips 310, and the chip antenna 320 or forming an antenna pattern on the circuit board 350.

Figure 17A:
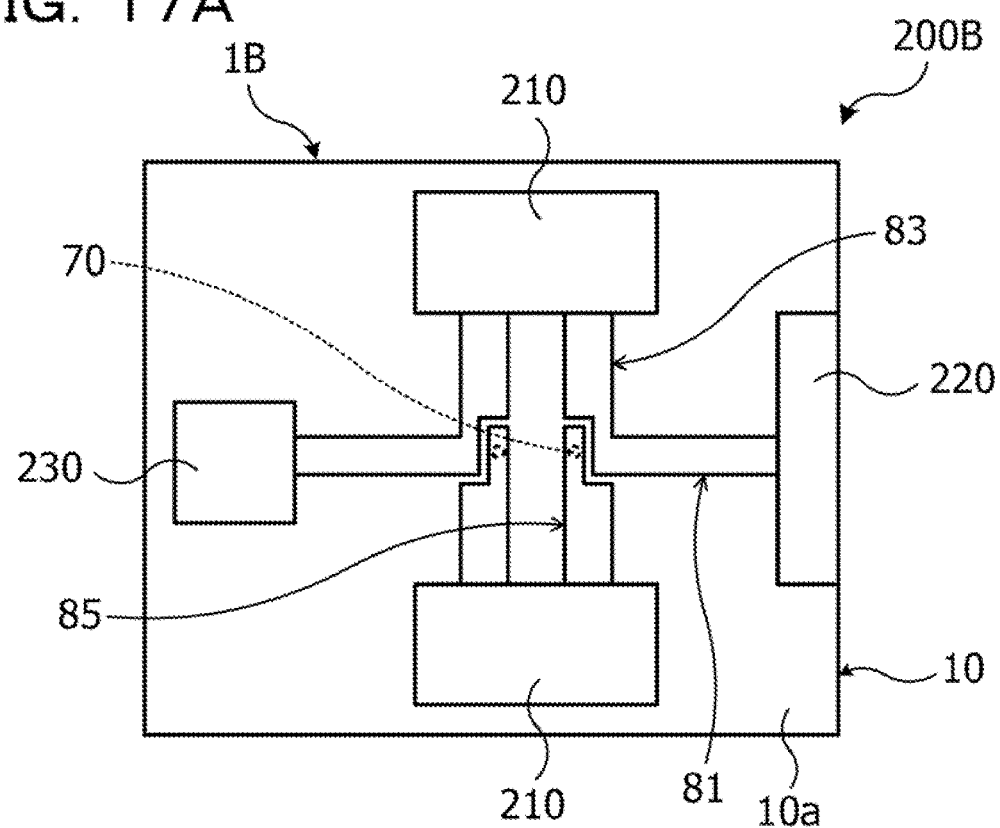
Figure 17B:
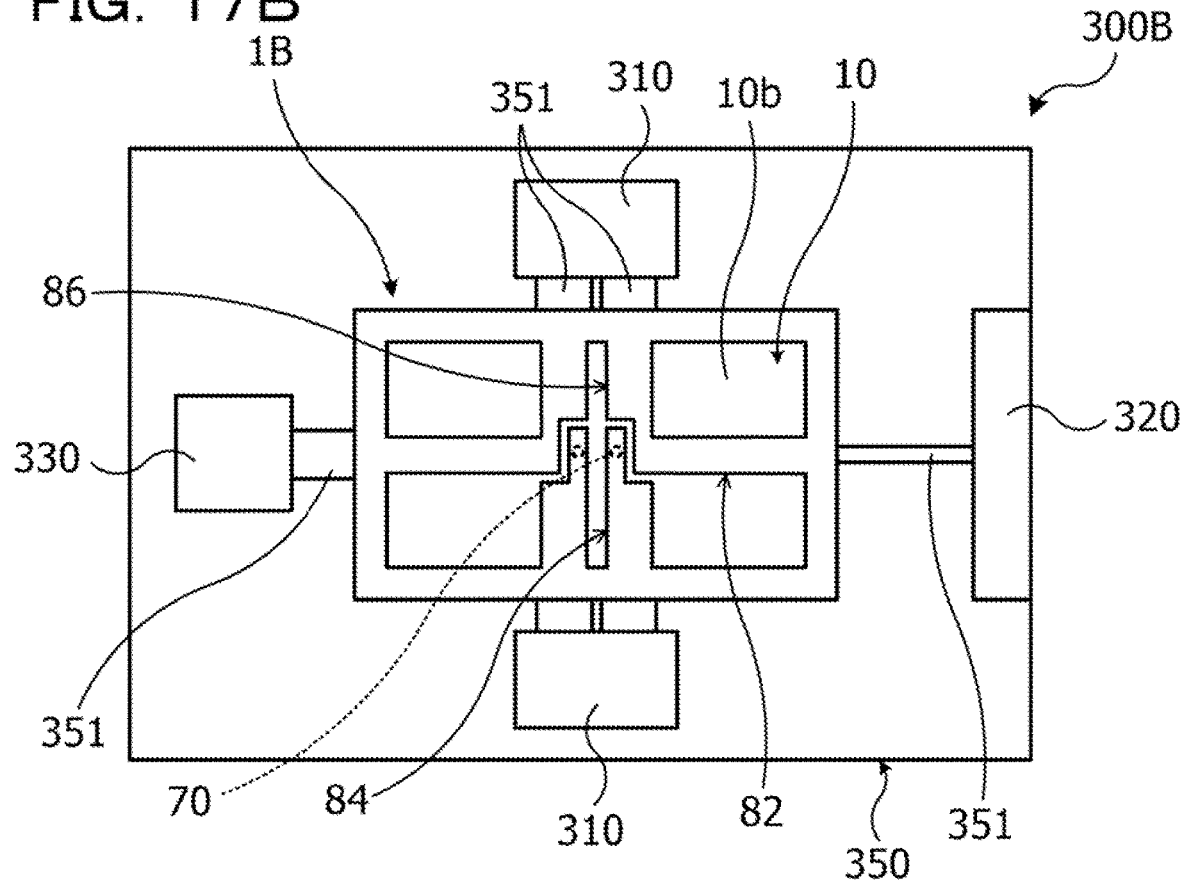

Furthermore, FIGS. 16, 17A, and 17B are diagrams describing a third example of the electronic device according to the third embodiment. FIG. 16 is a schematic plan view of a main part of an impedance converter cited as an example, FIGS. 17A and 17B are each a schematic plan view of a main part of an electronic device cited as the example, the electronic device using the impedance converter illustrated in FIG. 16.

An impedance converter 1B illustrated in FIG. 16 has a configuration in which a pair of sets of wires 81, 83, and 85 laid out as in the impedance converter 1 described above is arranged on a surface 10a that is one surface of an insulating layer 10 such that the sets of wires 81, 83, and 85 are bilaterally symmetric when viewed in plan. Although not illustrated in FIG. 16, the impedance converter 1B is also configured such that a pair of sets of wires 82, 84, and 86 laid out as in the impedance converter 1 described above is arranged on a surface 10b that is the other surface of the insulating layer 10 such that the sets of wires 82, 84, and 86 are bilaterally symmetric when viewed in plan.

For example, the impedance converter 1B as illustrated in FIG. 16 is used to implement an electronic device 200B as illustrated in FIG. 17A or an electronic device 300B as illustrated in FIG. 17B.

In the electronic device 200B illustrated in FIG. 17A, one of the group of semiconductor chips 210 is mounted on, for example, the surface 10a side of the insulating layer 10 of the impedance converter 13 such that an input terminal and an output terminal are connected to the respective wires 83 in the sets of wires. Moreover, the other one of the group of semiconductor chips 210 is mounted such that an input terminal and an output terminal are connected to the respective wires 85 in the sets of wires. A signal source 230 is mounted on the wire 81 in one of the sets of wires, and the chip antenna 220 is mounted on the wire 81 in the other set of wires.

According to the example illustrated in FIG. 17A, it is possible to obtain the electronic device 200B capable of implementing the function of the transmitter 2 having a configuration as illustrated in FIG. 11 described above.

Furthermore, in the electronic device 300B illustrated in FIG. 17B, for example, the impedance converter 1B is mounted on the circuit board 350 together with the group of semiconductor chips 310, the chip antenna 320, and a signal source 330. Note that the impedance converter 1B is mounted such that the surface 10a, which is the one surface of the insulating layer 10, faces the circuit board 350. The respective wires 83 in the sets of wires of the impedance converter 16 are connected to an input terminal and an output terminal of one of the group of semiconductor chips 310 by the wiring pattern 351. The respective wires 85 in the sets of wires are connected to an input terminal and an output terminal of the other one of the group of semiconductor chips 310 by the wiring pattern 351. The wire 81 in one of the sets of wires and the signal source 330 are connected by the wiring pattern 351, and the wire 81 in the other set of wires and the chip antenna 320 are connected by the wiring pattern 351.

It is also possible to obtain the electronic device 308B capable of implementing the function of the transmitter 2 having a configuration as illustrated in FIG. 11 described above, according to the example illustrated in FIG. 17B.

Note that in addition to the above, other electronic elements (semiconductor chips, chip parts, circuits, and the like) may be further mounted on the impedance converter 18 and the circuit board 350.

Furthermore, instead of mounting the chip antenna 220 or the chip antenna 320, it is also possible to form an antenna pattern on the insulating layer 10 or the circuit board 350.

Moreover, it is also possible to obtain an impedance converter in which a layout as mentioned above in the description of the impedance converter 1A has been adopted. For example, an impedance converter may be obtained, in which the pair of sets of wires 81, 83, and 85 laid out such that angles therebetween are obtuse is arranged on the surface 10a of the insulating layer 10 such that the sets of wires 81, 83, and 85 are bilaterally symmetric when viewed in plan and the pair of sets of wires 82, 84, and 86 is arranged on the surface 10b of the insulating layer 10 such that the sets of wires 82, 84, and 86 are bilaterally symmetric when viewed in plan. It is also possible to obtain an electronic device by using such an impedance converter according to the examples illustrated in FIGS. 17A and 17B described above.

Fourth Embodiment

It is possible to mount, on various electronic apparatuses (also referred to as electronic devices), the impedance converter 1, the impedance converter 1A, the transmitter 2, the power amplifier 2c, the transmitter 3, the power amplifier 3d described above in the first and second embodiments, and the electronic device 200, the electronic device 300, the electronic device 200B, the electronic device 300B, and the like described above in the third embodiment. Examples of the various electronic apparatuses include computers (a personal computer, a supercomputer, a server, and the like), smartphones, portable telephones, tablet terminals, sensors, cameras, audio instruments, measuring apparatuses, inspection apparatuses, and manufacturing apparatuses.

Figure 18:
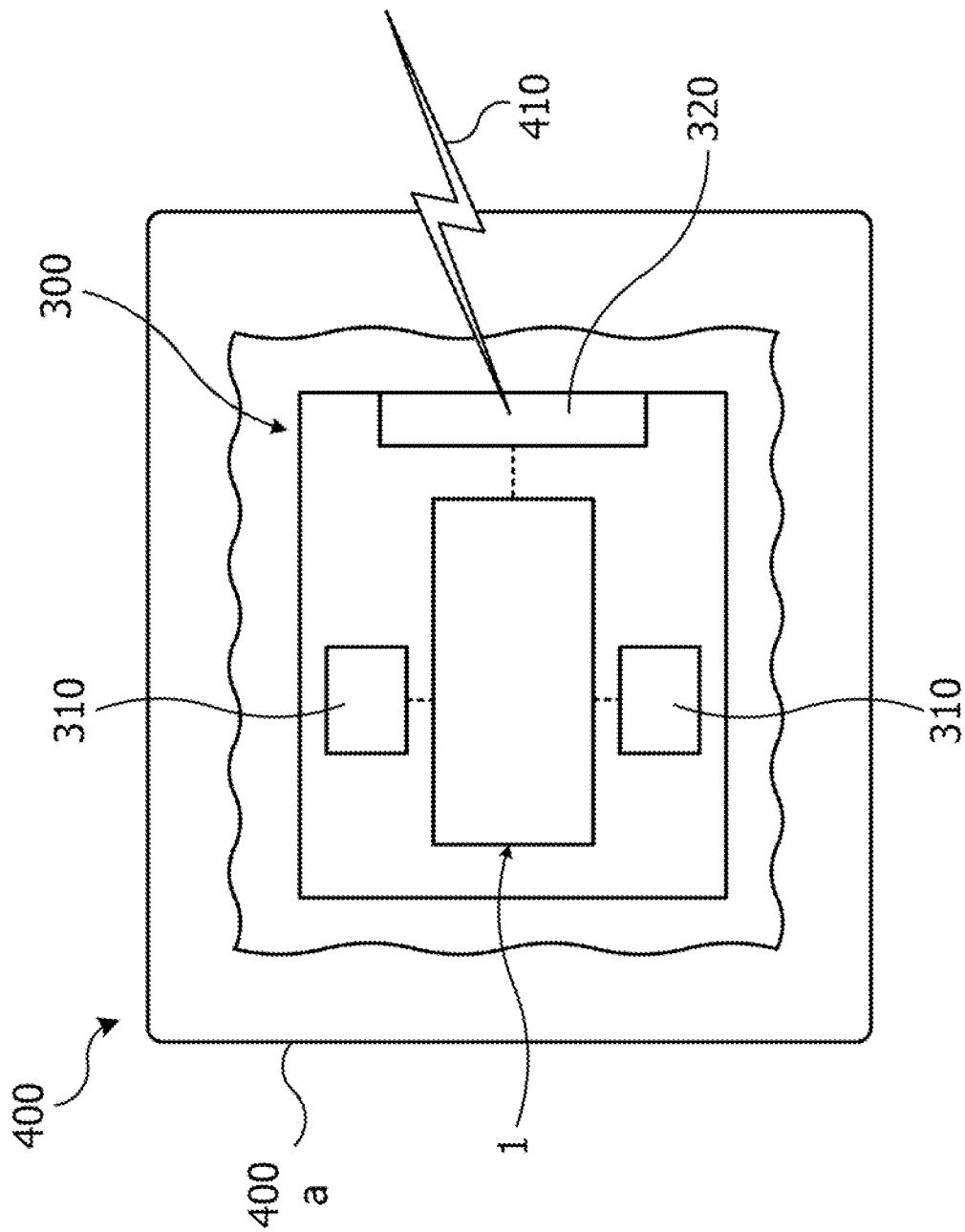
FIG. 18 is a diagram describing an example of an electronic apparatus according to a fourth embodiment.

FIG. 18 is a diagram describing an example of an electronic apparatus according to a fourth embodiment. FIG. 18 schematically illustrates the electronic apparatus.

As illustrated in FIG. 18, for example, the electronic device 300 (FIGS. 15A and 15B) configured as described above in the third embodiment is incorporated in (built into) a housing 400a of an electronic apparatus 400 that is one of the various electronic apparatuses. Note that the electronic device 300 may be housed in a rack or a slot included in the electronic apparatus 400.

As described above, the electronic device 300 has a configuration in which the impedance converter 1 (or the impedance converter 1A described in the second embodiment) described above in the first embodiment, the group of semiconductor chips 310, and the chip antenna 320 are mounted on the circuit board 350. In the electronic device 300, signals amplified by the group of semiconductor chips 310 are combined and impedance-matched by use of the impedance converter 1 and supplied to the chip antenna 320, so that a composite signal 410 is output from the chip antenna 320. The impedance converter 1 (or impedance converter 1A), which enables occurrence of unnecessary electromagnetic field coupling to be avoided and has excellent characteristics, is used to implement the electronic device 300 with high performance and high quality. The electronic device 300 as described above is mounted to implement the electronic apparatus 400 with high performance and high quality.

Here, the electronic apparatus 400 equipped with the electronic device 300 has been cited as an example. Meanwhile, it is also possible to implement various electronic apparatuses equipped with the impedance converter 1, the impedance converter 1A, the transmitter 2, the power amplifier 2c, the transmitter 3, the power amplifier 3d, the electronic device 200, the electronic device 200B, the electronic device 300B, and/or the like.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention,

What is claimed is:

1. An impedance converter comprising:
   an insulating layer;
   a first wire provided on a first surface of the insulating layer and extending in a first direction;
   a second wire provided on a second surface of the insulating layer and extending in the first direction and face the first wire, the second surface being located on a side opposite to the first surface;
   a third wire provided on the first surface and extending in a second direction orthogonal to the first direction;
   a fourth wire provided on the second surface and extending in the second direction and face the third wire;
   a fifth wire provided on the first surface and extending in the second direction; and
   a sixth wire provided on the second surface and extending in the second direction and face the fifth wire.

2. The impedance converter according to claim 1, wherein the impedance converter further comprising:
   a first connection portion that connects a first-side end portion of the first wire and a second-side end portion of the third wire, the first-side end portion of the first wire being located on a first side in the first direction, the second-side end portion of the third wire being located on a second side in the second direction;
   a second connection portion that connects a first-side end portion of the second wire and a third-side end portion of the sixth wire, the first-side end portion of the second wire being located on the first side in the first direction, the third-side end portion of the sixth wire being located on a third side opposite to the second side in the second direction; and
   a third connection portion that connects a second-side end portion of the fourth wire and a third-side end portion of the fifth wire, the second-side end portion of the fourth wire being located on the second side in the second direction, the third-side end portion of the fifth wire being located on the third side in the second direction.

3. The impedance converter according to claim 2, wherein the second wire, the fourth wire, and the sixth wire are grounded.

4. The impedance converter according to claim 2, wherein the third connection portion includes a conductor via that penetrates the insulating layer.

5. The impedance converter according to claim 2, wherein the third wire includes a first input port, the fifth wire includes a second input port, the first wire includes an output port, and when a first signal is input from the first input port, a second signal is input from the second input port, and a third signal is output from the output port, a pair of the third and fourth wires, a pair of the fifth and sixth wires, and a pair of the first and second wires are each connected by electromagnetic field coupling.

6. The impedance converter according to claim 2, wherein the first wire includes an input port, the third wire includes a first output port, the fifth wire includes a second output port, and when a first signal is input from the input port, a second signal is output from the first output port, and a third signal is output from the second output port, a pair of the first and second wires, a pair of the third and fourth wires, and a pair of the fifth and sixth wires are each connected by electromagnetic field coupling.

7. An electronic device comprising:
an insulating layer;
a first wire provided on a first surface of the insulating layer and extending in a first direction;
a second wire provided on a second surface of the insulating layer and extending in the first direction and face the first wire, the second surface being located on a side opposite to the first surface;
a third wire provided on the first surface and extending in a second direction orthogonal to the first direction;
a fourth wire provided on the second surface and extending in the second direction and face the third wire;
a fifth wire provided on the first surface and extending in the second direction; and
a sixth wire provided on the second surface and extending in the second direction and face the fifth wire.

8. The electronic device comprising according to claim 7, wherein the impedance converter further comprising:
a first connection portion that connects a first-side end portion of the first wire and a second-side end portion of the third wire, the first-side end portion of the first wire being located on a first side in the first direction, the second-side end portion of the third wire being located on a second side in the second direction;
a second connection portion that connects a first-side end portion of the second wire and a third-side end portion of the sixth wire, the first-side end portion of the second wire being located on the first side in the first direction, the third-side end portion of the sixth wire being located on a third side opposite to the second side in the second direction; and
a third connection portion that connects a second-side end portion of the fourth wire and a third-side end portion of the fifth wire, the second-side end portion of the fourth wire being located on the second side in the second direction, the third-side end portion of the fifth wire being located on the third side in the second direction.

9. The electronic device according to claim 8, wherein the first electronic element and the second electronic element each include an amplifier element.

10. The electronic device according to claim 8, wherein the third electronic element includes an antenna or a signal source.

* * * * *